US009837468B2

(12) United States Patent
Kim et al.

(10) Patent No.: US 9,837,468 B2
(45) Date of Patent: Dec. 5, 2017

(54) MAGNETORESISTIVE RANDOM ACCESS MEMORY DEVICE AND METHOD OF MANUFACTURING THE SAME

(71) Applicant: SAMSUNG ELECTRONICS CO., LTD., Suwon-si, Gyeonggi-do (KR)

(72) Inventors: Kwang-Seok Kim, Seoul (KR); Kee-Won Kim, Suwon-si (KR); Whan-Kyun Kim, Seoul (KR); Sang-Hwan Park, Hwaseong-si (KR); Young-Man Jang, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/202,708

(22) Filed: Jul. 6, 2016

(65) Prior Publication Data

US 2017/0110508 A1 Apr. 20, 2017

(30) Foreign Application Priority Data

Oct. 15, 2015 (KR) .......................... 10-2015-0143897

(51) Int. Cl.
| | | |
|---|---|---|
| H01L 43/08 | (2006.01) | |
| H01L 27/22 | (2006.01) | |
| H01L 43/10 | (2006.01) | |
| H01L 43/02 | (2006.01) | |

(52) U.S. Cl.
CPC ............ *H01L 27/228* (2013.01); *H01L 43/02* (2013.01); *H01L 43/08* (2013.01); *H01L 43/10* (2013.01)

(58) Field of Classification Search
CPC ......... H01L 43/02; H01L 43/08; H01L 43/10; H01L 27/228; G11C 11/14–11/16; G11C 11/161
See application file for complete search history.

(56) References Cited

U.S. PATENT DOCUMENTS

| | | | |
|---|---|---|---|
| 8,184,411 B2 | 5/2012 | Zhang et al. | |
| 8,223,533 B2 * | 7/2012 | Ozeki .................... | B82Y 25/00 365/158 |
| 8,546,896 B2 | 10/2013 | Lottis et al. | |
| 8,836,056 B2 | 9/2014 | Oguz et al. | |
| 8,946,837 B2 | 2/2015 | Watanabe et al. | |

(Continued)

FOREIGN PATENT DOCUMENTS

| | | | |
|---|---|---|---|
| JP | 2013-016643 A | 1/2013 | |
| JP | 2014-022730 A | 2/2014 | |

(Continued)

*Primary Examiner* — Allison P Bernstein
(74) *Attorney, Agent, or Firm* — Lee & Morse, P.C.

(57) ABSTRACT

A magnetoresistive random access memory device includes a free layer, a tunnel barrier layer, an insulation barrier layer, a pinned layer, and a vertical polarizer structure. The tunnel barrier layer and the insulation barrier layer directly contacts different surfaces of the free layer. The pinned layer structure contacts the tunnel barrier layer and includes at least one pinned layer. The vertical polarizer structure contacts the insulation barrier layer and includes a plurality of magnetization multi-layered structures sequentially stacked. Each magnetization multi-layered structure includes a non-magnetic layer and a magnetic layer sequentially stacked. The pinned layer and the magnetic layer have magnetization directions anti-parallel to each other.

20 Claims, 30 Drawing Sheets

(56) References Cited

U.S. PATENT DOCUMENTS

| | | | |
|---|---|---|---|
| 2011/0140217 A1* | 6/2011 | Nguyen | B82Y 25/00 |
| | | | 257/421 |
| 2013/0009259 A1 | 1/2013 | Watanabe et al. | |
| 2013/0075845 A1 | 3/2013 | Chen et al. | |
| 2013/0087870 A1 | 4/2013 | Ranjan et al. | |
| 2014/0021426 A1 | 1/2014 | Lee et al. | |
| 2014/0027869 A1 | 1/2014 | Lee et al. | |
| 2014/0084398 A1 | 3/2014 | Oguz et al. | |

FOREIGN PATENT DOCUMENTS

| | | |
|---|---|---|
| KR | 10-2009-0113327 A | 10/2009 |
| KR | 10-2015-0031311 A | 3/2015 |

\* cited by examiner

MAGNETORESISTIVE RANDOM ACCESS MEMORY DEVICE AND METHOD OF MANUFACTURING THE SAME

CROSS-REFERENCE TO RELATED APPLICATION

Korean Patent Application No. 10-2015-0143897, filed on Oct. 15, 2015, and entitled: "Magnetoresistive Random Access Memory Device and Method of Manufacturing the Same," is incorporated by reference herein in its entirety.

BACKGROUND

1. Field

One or more embodiments described herein relate to a magnetoresistive random access memory device and a method for manufacturing a magnetoresistive random access memory device.

2. Description of the Related Art

In a magnetoresistive random access memory (MRAM) device, data may be stored based on a change in resistance of a magnetic tunnel junction (MTJ) structure. Attempts have been made to improve the magnetization characteristics of the MTJ structure.

SUMMARY

In accordance with one or more embodiments, an magnetoresistive random access memory device includes a free layer; a tunnel barrier layer directly contacting a first one of upper or lower surfaces of the free layer; an insulation barrier layer directly contacting a second one of the upper or lower surfaces of the free layer; a pinned layer structure contacting the tunnel barrier layer and including at least one pinned layer; and a vertical polarizer structure contacting the insulation barrier layer, the vertical polarizer structure including a plurality of magnetization multi-layered structures sequentially stacked, each of the magnetization multi-layered structures including a non-magnetic layer and a magnetic layer sequentially stacked, wherein the pinned layer contacting the tunnel barrier layer and the magnetic layer contacting the insulation barrier layer have magnetization directions anti-parallel to each other.

The pinned layer structure may include a lower pinned layer, a spacer, and an upper pinned layer sequentially stacked. Each of the lower and upper pinned layers may include a magnetic material having vertical anisotropy, and thicknesses of the lower and upper pinned layers are different. Magnetization directions of the lower and upper pinned layers may be anti-parallel to each other.

The magnetization multi-layered structures may have magnetization directions anti-parallel to each other. The magnetic layer of one of the magnetization multi-layered structures may have a thickness greater than thicknesses of the magnetic layers of other ones of the magnetization multi-layered structures.

A magnetization direction of the pinned layer contacting the tunnel barrier layer may be equal to a magnetization direction of the total pinned layer structure, and the magnetic layer of one of the magnetization multi-layered structures at an even-numbered level from the insulation barrier layer may have a thickness greater than thicknesses of the magnetic layers of other ones of the magnetization multi-layered structures.

A magnetization direction of the pinned layer contacting the tunnel barrier layer may be different from a magnetization direction of the total pinned layer structure, and the magnetic layer of one of the magnetization multi-layered structures at an odd-numbered level from the insulation barrier layer may have a thickness greater than thicknesses of the magnetic layers of other ones of the magnetization multi-layered structures.

The magnetic layer of each of the magnetization multi-layered structures may include a magnetic material having vertical anisotropy, and the non-magnetic layer of each of the magnetization multi-layered structures may include a metal. The magnetic layer may include Fe, Co, or Ni, and the non-magnetic layer may include Ir, Pd, or Pt. The magnetic layer may include Co, and the non-magnetic layer may include Ir.

The magnetic layer may have a face centered cubic structure or a hexagonal close packing structure. Each of the tunnel barrier layer and the insulation barrier layer may include aluminum oxide or magnesium oxide. The pinned layer structure may be under the free layer. The pinned layer structure may be on the free layer.

The pinned layer structure may include one pinned layer, and the magnetic layer of one of the magnetization multi-layered structures at an even-numbered level from the insulation barrier layer may have a thickness greater than thicknesses of the magnetic layers of other ones of the magnetization multi-layered structures.

In accordance with one or more other embodiments, a magnetoresistive random access memory device includes a free layer; a tunnel barrier layer directly contacting a first one of upper or lower surfaces of the free layer; an insulation barrier layer directly contacting a second one of the upper or lower surfaces of the free layer; a pinned layer structure contacting the tunnel barrier layer and including at least one pinned layer; and a vertical polarizer structure contacting the insulation barrier layer, the vertical polarizer structure including a plurality of magnetization multi-layered structures sequentially stacked, each of the magnetization multi-layered structures including a non-magnetic layer and a magnetic layer sequentially stacked, wherein the magnetic layer of one of the magnetization multi-layered structures has a thickness greater than thicknesses of the magnetic layers of other ones of the magnetization multi-layered structures.

The magnetization multi-layered structures may have magnetization directions anti-parallel to each other. A magnetization direction of the pinned layer contacting the tunnel barrier layer may be equal to a magnetization direction of the total pinned layer structure, and the magnetic layer of one of the magnetization multi-layered structures at an even-numbered level from the insulation barrier layer may have a thickness greater than thicknesses of the magnetic layers of other ones of the magnetization multi-layered structures.

A magnetization direction of the pinned layer contacting the tunnel barrier layer may be different from a magnetization direction of the total pinned layer structure, and the magnetic layer of one of the magnetization multi-layered structures at an odd-numbered level from the insulation barrier layer may have a thickness greater than thicknesses of the magnetic layers of other ones of the magnetization multi-layered structures.

In accordance with one or more other embodiments, a magnetoresistive random access memory device includes an insulating interlayer on a substrate and including a conductive pattern; a lower electrode contacting the conductive pattern; an MTJ structure on the lower electrode; an upper electrode on the MTJ structure; and a wiring structure electrically connected to the upper electrode. The MTJ structure includes a free layer; a tunnel barrier layer directly contacting a first one of upper or lower surfaces of the free layer; an insulation barrier layer directly contacting a second one of the upper or lower surfaces of the free layer; a pinned layer structure contacting the tunnel barrier layer and including at least one pinned layer; and a vertical polarizer structure contacting the insulation barrier layer, the vertical polarizer structure including a plurality of magnetization multi-layered structures sequentially stacked, each of the magnetization multi-layered structures including a non-magnetic layer and a magnetic layer sequentially stacked, wherein the pinned layer contacting the tunnel barrier layer and the magnetic layer contacting the insulation barrier layer have magnetization directions anti-parallel to each other.

The magnetic layer of one of the magnetization multi-layered structures may have a thickness greater than thicknesses of the magnetic layers of other ones of the magnetization multi-layered structures.

A magnetization direction of the pinned layer contacting the tunnel barrier layer may be equal to a magnetization direction of the total pinned layer structure, and the magnetic layer of one of the magnetization multi-layered structures at an even-numbered level from the insulation barrier layer may have a thickness greater than thicknesses of the magnetic layers of other ones of the magnetization multi-layered structures. A magnetization direction of the pinned layer contacting the tunnel barrier layer may be different from a magnetization direction of the total of the pinned layer structure, and the magnetic layer of one of the magnetization multi-layered structures at an odd-numbered level from the insulation barrier layer may have a thickness greater than thicknesses of the magnetic layers of other ones of the magnetization multi-layered structures.

In accordance with one or more other embodiments, a method of manufacturing a magnetoresistive random access memory includes forming a pinned layer structure including at least one pinned layer on a substrate; sequentially forming a tunnel layer, a free layer, and insulation barrier layer on a surface of the pinned layer structure; forming a vertical polarizer structure contacting the insulation barrier layer, the vertical polarizer structure including a plurality of magnetization multi-layered structures sequentially stacked, each of the magnetization multi-layered structures including a non-magnetic layer and a magnetic layer sequentially stacked, and the magnetic layer of one of the magnetization multi-layered structures has a thickness greater than thicknesses of the magnetic layers of other ones of the magnetization multi-layered structures; and applying an external magnetic field in a vertically upward direction from an upper surface of the substrate, so that the pinned layer structure and the vertical polarizer structure are magnetized.

The vertical polarizer structure may be formed such that the pinned layer contacting the tunnel barrier layer and a magnetic layer contacting the insulation barrier layer have magnetization directions anti-parallel to each other. The pinned layer structure may include a lower pinned layer, a spacer, and an upper pinned layer sequentially stacked.

Each of the lower and upper pinned layers may include a magnetic material having vertical anisotropy, and the lower and upper pinned layers may have different thicknesses.

One of the pinned layers contacting the tunnel barrier layer may have a thickness greater than a thickness of another one of the pinned layers, and the magnetic layer of one of the magnetization multi-layered structures at an even-numbered level from the insulation barrier layer may have a thickness greater than thicknesses of the magnetic layers of other ones of the magnetization multi-layered structures.

One of the pinned layers contacting the tunnel barrier layer may have a thickness less than a thickness of the other one of the pinned layers, and the magnetic layer of one of the magnetization multi-layered structures at an odd-numbered level from the insulation barrier layer may have a thickness greater than thicknesses of the magnetic layers of other ones of the magnetization multi-layered structures. The magnetic layer may include Fe, Co or Ni, and the non-magnetic layer may include Ir, Pd or Pt. The magnetic layer may include Co and the non-magnetic layer may include Ir.

In accordance with one or more other embodiments, a magnetoresistive random access memory includes a free layer; a pinned layer structure on a first side of the free layer; and a vertical polarizer structure on a second side of the free layer, wherein the vertical polarizer structure includes a plurality of stacked magnetic multi-layer structures, each of the magnetic multi-layer structure including a non-magnetic layer and a magnetic layer, and wherein the pinned layer and a magnetic multi-layer structure adjacent to the free layer have magnetization directions anti-parallel to each other.

Each of the magnetic multi-layer structures may have a magnetization direction based on a thickness of the corresponding magnetic layer. The pinned layer structure may include a lower pinned layer, a spacer, and an upper pinned layer sequentially stacked. Each of the lower and upper pinned layers may include a magnetic material having vertical anisotropy, and thicknesses of the lower and upper pinned layers may be different. Magnetization directions of the lower and upper pinned layers may be anti-parallel to each other.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
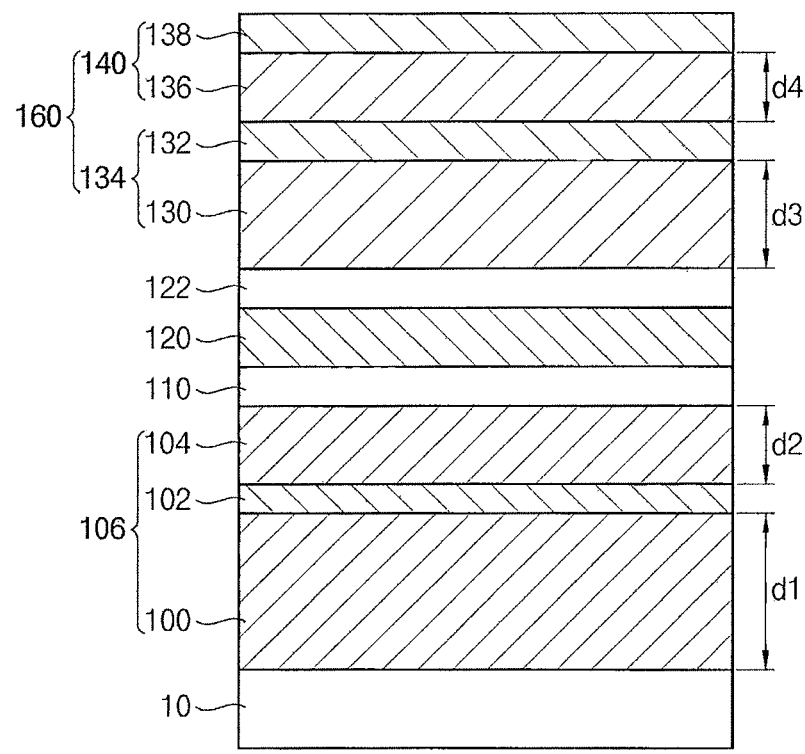
FIG. 1 illustrates an embodiment of an MTJ structure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly defined herein.

Figure 2:
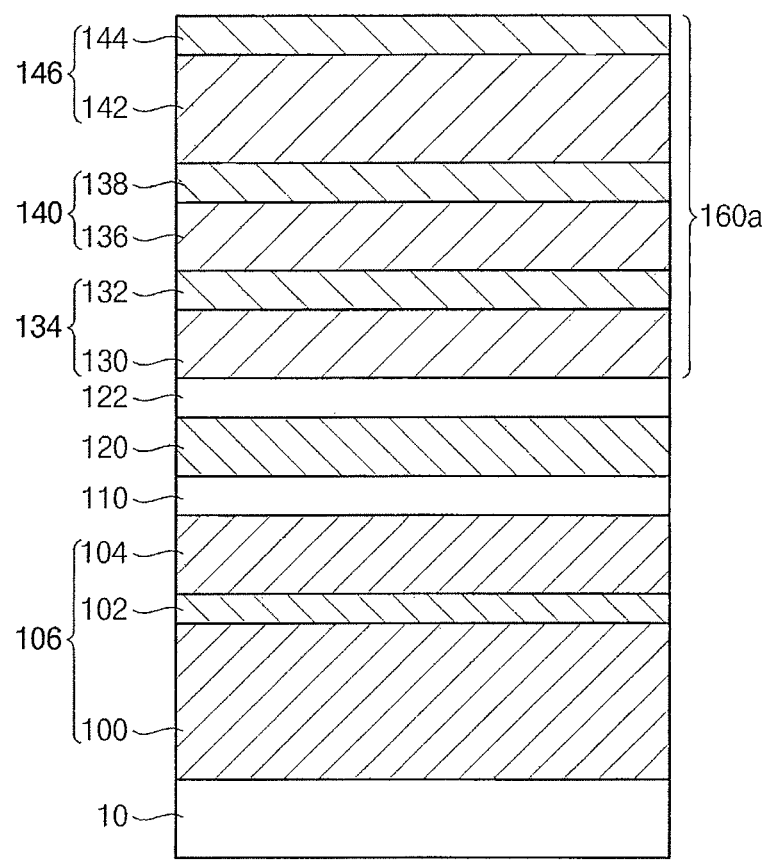
FIG. 2 illustrates another embodiment of an MTJ structure.

FIG. 1 illustrates a cross-sectional view of an embodiment of an MTJ structure, and FIG. 2 illustrates a cross-sectional view of another embodiment of an MTJ structure. The MTJ structure of FIG. 2 may be substantially the same as the MTJ structure of FIG. 1, except for a vertical polarizer structure.

Referring to FIG. 1, the MTJ structure may include a pinned layer structure 106, a tunnel barrier layer 110, a free layer 120, an insulation barrier layer 122, and a vertical polarizer structure 160 sequentially stacked on a substrate 10. A lower structure may be further formed between the substrate 10 and the MTJ structure.

The pinned layer structure 106 may include at least one pinned layer. When the pinned layer structure 106 includes a plurality of pinned layers, a spacer may be formed between the pinned layers. At least one of the pinned layers may have a thickness different from thicknesses of other pinned layers.

In the pinned layer structure 106, a magnetization direction may be determined by a thickest one of the pinned layers. Based on the magnetization direction of the thickest one of the pinned layers, the magnetization directions of others of the pinned layers may be determined to be anti-parallel to each other.

In example embodiments, the pinned layer structure 106 may include a lower pinned layer 100, a spacer 102, and an upper pinned layer 104 sequentially stacked. The lower and upper pinned layers 100 and 104 may have different thicknesses. The magnetization directions may be fixed in the lower and upper pinned layers 100 and 104, respectively.

In example embodiments, a magnetic moment of the lower pinned layer 100 may be greater than a magnetic moment of the upper pinned layer 104. In this case, the lower pinned layer 100 may have a first thickness d1, and the upper pinned layer 104 may have a second thickness d2 less than the first thickness d1.

Each of the lower and upper pinned layers 100 and 104 may include a material having vertical anisotropy. In example embodiments, each of the lower and upper pinned layers 100 and 104 may include a cobalt-based metal, a Fe-based metal, or alloys thereof. In other embodiments, each of the lower and upper pinned layers 100 and 104 may include a binary alloy, e.g., CoPt, FePt, FePd, MnFe, CoCr, etc., or a ternary alloy, e.g., CoCrPt.

The spacer 102 may include, e.g., a synthetic Anti-Ferromagnetic (SAF) material. The spacer 102 may serve as an anti-ferromagnetic coupling spacer, so that the magnetization directions of the lower and upper pinned layers 100 and 104 may be fixed to be anti-parallel to each other. In example embodiments, the spacer 102 may include at least one of ruthenium (Ru), iridium (Ir), palladium (Pd), osmium (Os), or rhodium (Rh).

In example embodiments, the tunnel barrier layer 110 may include an insulative metal oxide, e.g., aluminum oxide or magnesium oxide.

An insulation tunnel barrier, which may be generated by quantum mechanical tunneling and/or spin polarization, may be formed between the free layer 120 and the pinned layer structure 106 by the tunnel barrier layer 110.

The free layer 120 may have a variable magnetization direction. The free layer 120 may include a ferromagnetic material, e.g., Fe, Co, Ni, Cr, Pt, or the like. The free layer 120 may further include, e.g., boron or silicon. These materials may be used alone or in combination. The free layer 120 may include a metal alloy, e.g., CoFe, NiFe, FeCr, CoFeNi, PtCr, CoCrPt, CoFeB, NiFeSiB, CoFeSiB, or the like.

In example embodiments, the insulation barrier layer 122 may include an insulative metal oxide substantially the same as or similar to the insulative metal oxide of the tunnel barrier layer 110. As the insulation barrier layer 122 is formed, vertical anisotropy of the free layer 120 may be improved. As a result, the MTJ structure may have good data retention characteristics.

The vertical polarizer structure 160 may be formed on the insulation barrier layer 122. For example, the insulation barrier layer 122 may be between the vertical polarizer structure 160 and the free layer 120. The vertical polarizer structure 160 may transfer spin-torque to the free layer 120, so that operating currents of the MTJ structure may be decreased.

The vertical polarizer structure 160 may include a plurality of magnetization multi-layered structures, e.g., first and second magnetization multi-layered structures 134 and 140 sequentially stacked. In example embodiments, the first magnetization multi-layered structure 134 may include a first magnetic layer 130 and a first non-magnetic layer 132 sequentially stacked. The second magnetization multi-layered structure 140 may include a second magnetic layer 136 and a second non-magnetic layer 138 sequentially stacked. A lowermost layer of the vertical polarizer structure 160 (e.g., the first magnetic layer 130) may directly contact the insulation barrier layer 122.

The first and second magnetic layers 130 and 136 may include a material including vertical anisotropy. The first and second non-magnetic layers 132 and 138 may include a metal. Each of the first and second magnetic layers 130 and 136 in the respective first and second magnetization multi-layered structures 134 and 140 may have a fixed magnetization direction. The magnetization directions of the first and second magnetic layers 130 and 136 adjacent to each other may be anti-parallel to each other. Each of the first and second magnetic layers 130 and 136 in the respective first and second magnetization multi-layered structures 134 and 140 may have a thickness in a predetermined range, e.g., about 1 Å to about 30 Å. The first and second non-magnetic layers 132 and 138 in the respective first and second magnetization multi-layered structures 134 and 140 may have a thickness in a predetermined range, e.g., about 5 Å to about 30 Å.

In example embodiments, the first and second magnetic layers 130 and 136 may include, e.g., Fe, Co, Ni, etc. The first and second non-magnetic layers 132 and 138 may include, e.g., Ir, Pd, Pt, etc.

The first and second magnetic layers 130 and 136 may have a face centered cubic (FCC) structure or a hexagonal close packing (HCP) structure, so that the first and second magnetic layers 130 and 136 may have vertical anisotropy.

Each of the first and second magnetization multi-layered structures 134 and 140 of the vertical polarizer structure 160 may include, for example, a cobalt layer and an iridium layer sequentially stacked. The cobalt layer having an FCC structure may be easily formed on the iridium layer. Thus, the cobalt layers in the vertical polarizer structure 160 may have magnetization directions that may be anti-parallel to each other.

The magnetic layer of one of the magnetization multi-layered structures may have a thickness greater than thicknesses of the magnetic layers of the other ones of the magnetization multi-layered structures. The magnetization direction of the one magnetization multi-layered structure including the thickest one of the magnetic layers may be determined to be substantially the same as the magnetization direction of the thickest one of the pinned layers in the pinned layer structure 106. When the magnetization direction of the one of the magnetization multi-layered structures including the thickest one of the magnetic layers is determined, the magnetization directions of the other ones of the magnetization multi-layered structures, respectively, may be determined to be anti-parallel thereto.

The magnetic layer (e.g., magnetic layer 130) and the pinned layer (e.g., upper pinned layer 104) adjacent to the free layer 120 may have magnetization anti-parallel to each other, in order to increase the efficiency of a spin-torque of the free layer 120. For example, the first magnetization multi-layered structure 134 directly contacting the insulation barrier layer 122 may have a magnetization direction anti-parallel to a magnetization direction of the upper pinned layer 104 directly contacting the tunnel barrier layer 110. As described above, the one of the magnetization multi-layered structures including the thickest one of the magnetic layers may have a target magnetization direction.

In example embodiments, when the magnetization direction of the upper pinned layer 104 directly contacting the tunnel barrier layer 110 is different from the magnetization direction of the total pinned layer structure 106, the magnetic layer of one of the magnetization multi-layered structures at an odd-numbered level from the insulation barrier layer 122 may have a thickness greater than thicknesses of the magnetic layers of the other ones of the magnetization multi-layered structures.

Alternatively, when the magnetization direction of the upper pinned layer 104 directly contacting the tunnel barrier layer 106 is the same as the magnetization direction of the total of the pinned layer structure 106, the magnetic layer of one of the magnetization multi-layered structures at an even-numbered level from the insulation barrier layer 122 may have a thickness greater than thicknesses of the magnetic layers of the other ones of the magnetization multi-layered structures.

As described above, the vertical polarizer structure 160 may include a first magnetization multi-layered structure to an n-th magnetization multi-layered structure (n is a natural number more than 1). The first magnetization multi-layered structure 134 may include the first magnetic layer 130 and the first non-magnetic layer 132. The n-th magnetization multi-layered structure may include an n-th magnetic layer and an n-th non-magnetic layer.

In summary, when the upper pinned layer 104 has a different magnetization direction from the total pinned layer structure, the magnetic layer of the vertical polarizer structure 160, that is either adjacent to the free layer 120 (magnetic layer 130 (level 1)) or the alternating layers thereafter (i.e., odd-numbered layers), may have the greatest thickness and the same magnetization direction of the pinned layer structure 106. When the upper pinned layer 104 has the same magnetization direction as the pinned layer structure, a magnetic layer that is not adjacent to the free layer 120 (magnetic layer 136) (level 2)) or alternating layers thereafter (i.e., even-numbered levels) may have a greatest thickness and the same magnetization direction of the pinned layer structure 106. Thus, the pinned layer and the magnetic layer adjacent to the free layer have magnetization directions that are anti-parallel to each other.

As shown in FIG. 1, the thickness of the lower pinned layer 100 may be greater than the thickness of the upper pinned layer 104. In this case, a magnetization direction of the total pinned layer structure 106 may be the same as a magnetization direction of the lower pinned layer 100. Thus, the magnetization direction of the upper pinned layer 104 directly contacting the tunnel barrier layer 110 may be different from the magnetization direction of the total pinned layer structure 106. The magnetic layer of one of the magnetization multi-layered structures at an odd-numbered level from the insulation barrier layer 122 may have a thickness greater than thicknesses of the magnetic layers of the other ones of the magnetization multi-layered structures.

In example embodiments, as shown in FIG. 1, the vertical polarizer structure 160 may have first and second magnetization multi-layered structures 134 and 140. The first magnetic layer 130 in the first magnetization multi-layered structure 134 may have a third thickness d3, and the second magnetic layer 136 in the second magnetization multi-layered structure 140 may have a fourth thickness d4 less than the third thickness d3.

In example embodiments, as shown in FIG. 2, the vertical polarizer structure 160 may have the first magnetization multi-layered structure 134, the second magnetization multi-layered structure 140, and a third magnetization multi-layered structure 146 sequentially stacked. One of the magnetic layers in either of the first magnetization multi-layered structure 134 or of the third magnetization multi-layered structure 146, located at odd-numbered levels from the insulation barrier layer 122, may have a thickness greater than thicknesses of the magnetic layers of the other magnetization multi-layered structures. For example, a third magnetic layer 142 in the third magnetization multi-layered structure 146 may have a thickness greater than thicknesses of the first and second magnetic layers 130 and 136.

Figure 3A:
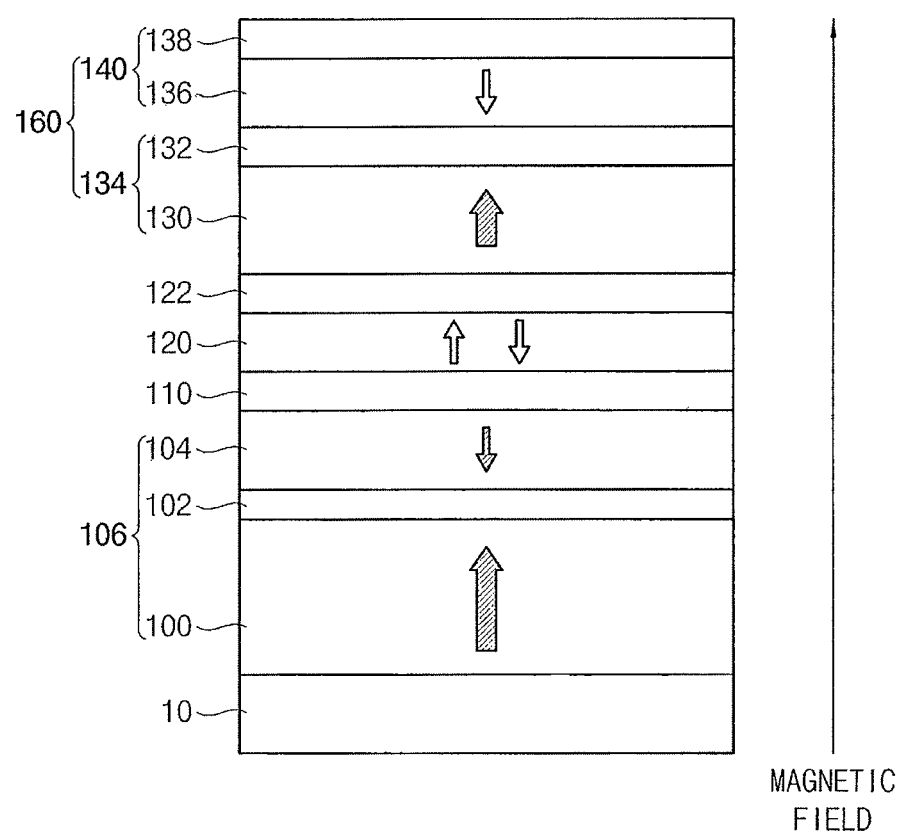
FIGS. 3A and 3B illustrate examples of magnetization directions of layers in the MTJ structure in FIG. 1 according to magnetic moment alignment.
Figure 3B:
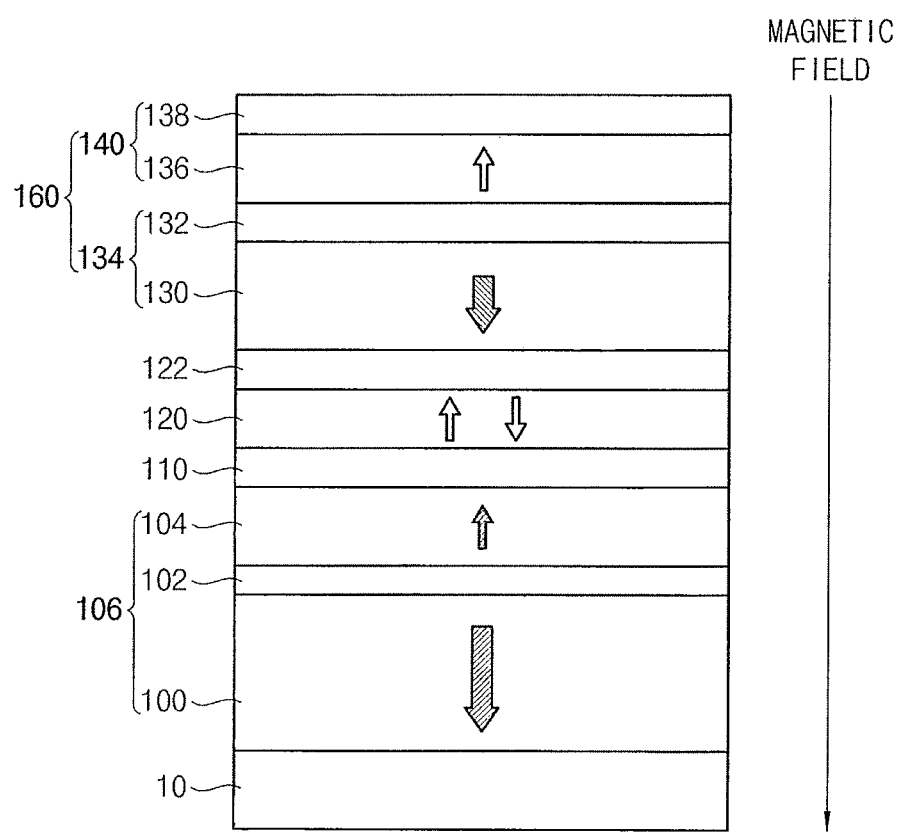
Figure 3C:
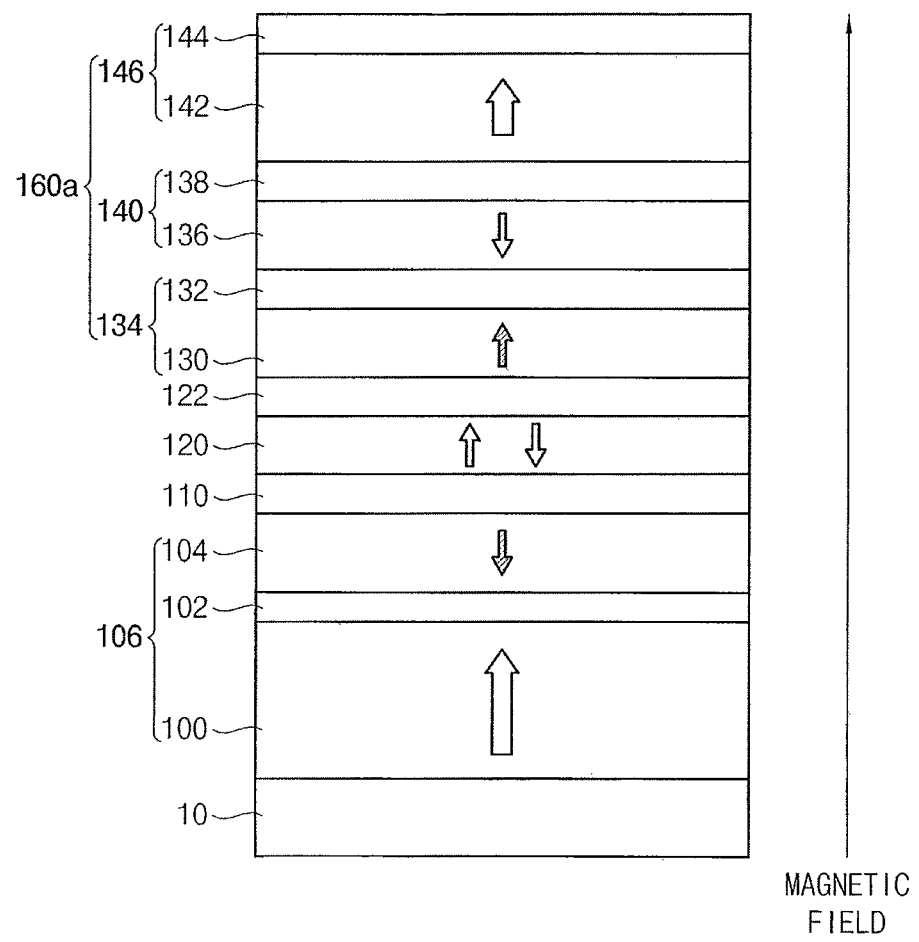
FIG. 3C illustrates an example of magnetization directions of layers in the MTJ structure according to magnetic moment alignment.

FIG. 3A shows an example of magnetization directions of the layers in the MTJ structure in FIG. 1 according to magnetic moment alignment. FIG. 3B shows another example of magnetization directions of the layers in the MTJ structure in FIG. 1 according to magnetic moment alignment. FIG. 3C shows an example of magnetization directions of the layers in the MTJ structure in FIG. 2 according to magnetic moment alignment. (A first direction may be defined as an upward vertical direction from an upper surface of the substrate, and a second direction may be defined as a downward vertical direction to the upper surface of the substrate. Thus, the first and second directions may be anti-parallel to each other.)

Referring to FIG. 3A, a magnetic field may be applied to the MTJ structure of FIG. 1 in the first direction with heat, so that the magnetic moment of the MTJ structure may be aligned. An external magnetic field may be applied to the vertical polarizer structure 160 from the pinned layer structure 106 in the MTJ structure. Thus, the magnetization direction of the lower pinned layer 100 having the greatest thickness in the pinned layer structure 106 may be determined as the first direction. The magnetization direction of the upper pinned layer 104 may be determined as the second direction. Also, the magnetization direction of the total pinned layer structure 106 may be determined as the first direction that may be the same as the magnetization direction of the lower pinned layer 100 having the greatest thickness.

The first magnetic layer 130 of the first magnetization multi-layered structure 134 may have the greatest thickness in the vertical polarizer structure 160, so that the magnetization direction of the first magnetic layer 130 may be determined as the first direction. Thus, the magnetization direction of the second magnetic layer 136 of the second magnetization multi-layered structure 140 may be determined as the second direction. Thus, the upper pinned layer 104 and the first magnetic layer 130 adjacent to the free layer 120 may have magnetization directions anti-parallel to each other.

Referring to FIG. 3B, the magnetic field may be applied to the MTJ structure of FIG. 1 in the second direction with heat, so that the magnetic moment of the MTJ structure may be aligned. An external magnetic field may be applied to the pinned layer structure 106 from the vertical polarizer structure 160 in the MTJ structure. Thus, the magnetization direction of the lower pinned layer 100 may be determined as the second direction. The magnetization direction of the upper pinned layer 104 may be determined as the first direction. Thus, the magnetization direction of the total pinned layer structure 106 may be determined as the second direction, which may be the same as the magnetization direction of the lower pinned layer 100.

In the vertical polarizer structure 160, the magnetization direction of the first magnetic layer 130 of the first magnetization multi-layered structure 134 may be determined as the second direction. Thus, a magnetization direction of the second magnetic layer 136 of the second magnetization multi-layered structure 140 may be determined as the first direction. Thus, the upper pinned layer 104 and the first magnetic layer 130 adjacent to the free layer 120 may have magnetization directions that may be anti-parallel to each other.

Referring to FIG. 3C, a magnetic field may be applied to the MTJ structure of FIG. 2 in the first direction with heat, so that the magnetic moment of the MTJ structure may be aligned. An external magnetic field may be applied to the vertical polarizer structure 160a from the pinned layer structure 106 in the MTJ structure. Thus, the magnetization direction of the lower pinned layer 100 having the greatest thickness in the pinned layer structure 106 may be determined as the first direction. The magnetization direction of the upper pinned layer 104 may be determined as the second direction. The magnetization direction of the total pinned layer structure 106 may be determined as the first direction that may be the same as the magnetization direction of the lower pinned layer 100 having the greatest thickness in pinned layer structure 106.

In the vertical polarizer structure, the third magnetic layer 142 of the third magnetization multi-layered structure 146 may have the greatest thickness, so that the magnetization direction of the third magnetic layer 142 may be determined as the first direction. Thus, magnetization directions of the first and third magnetization multi-layered structures 134 and 146 at odd-numbered levels, respectively, from the insulation barrier layer 122 may be determined as the first direction, and the magnetization direction of the second magnetization multi-layered structure 140 at an even-numbered level from the insulation barrier layer 122 may be determined as the second direction.

Thus, the upper pinned layer 104 and the first magnetic layer 130 adjacent to the free layer may have magnetization directions anti-parallel to each other.

Figure 4:
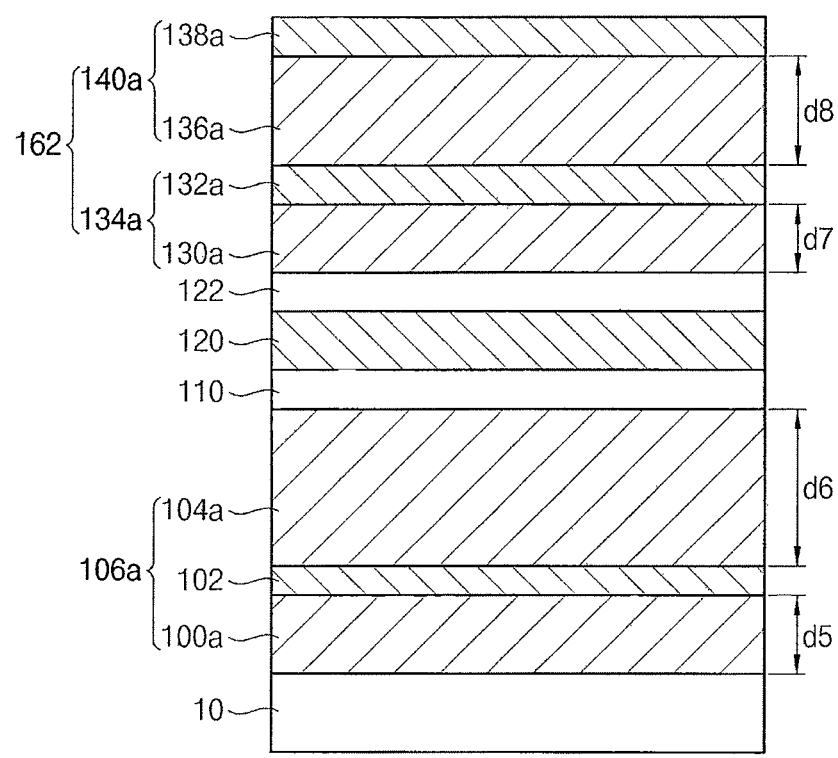
FIG. 4 illustrates another embodiment of an MTJ structure.
Figure 5:
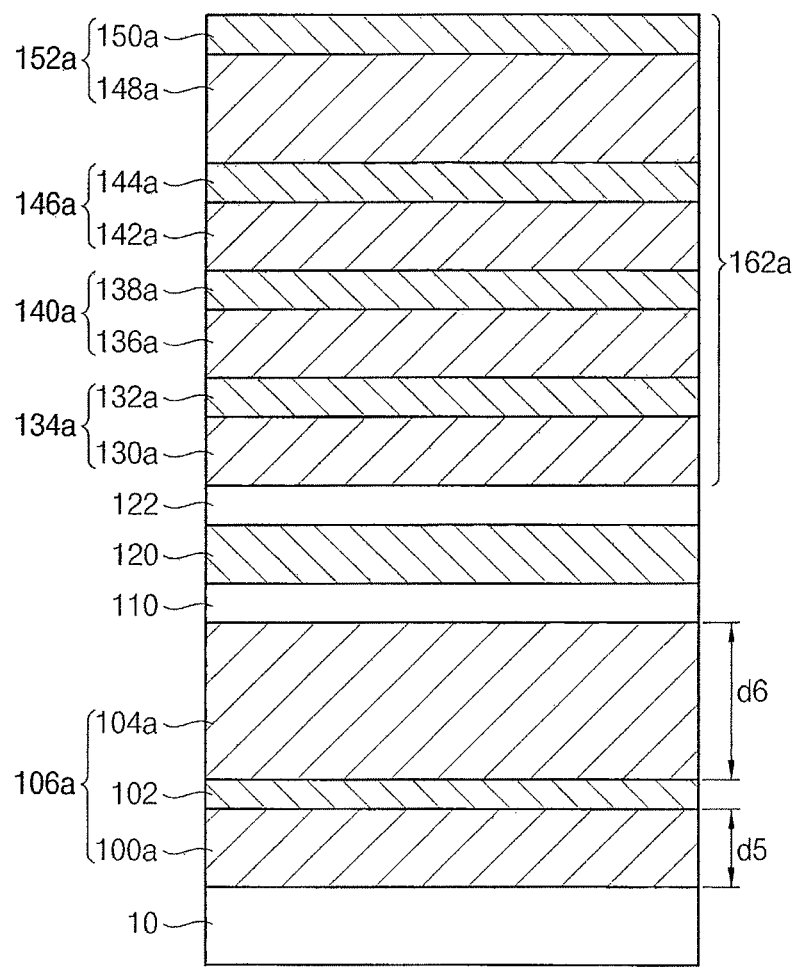
FIG. 5 illustrates another embodiment of an MTJ structure.

FIG. 4 illustrates a cross-sectional view of another embodiment of an MTJ structure. FIG. 5 illustrates a cross-sectional view of another embodiment of an MTJ structure. The MTJ structure of FIG. 5 may be substantially the same as the MTJ structure of FIG. 4 except for a vertical polarizer structure.

Referring to FIG. 4, the MTJ structure may include a pinned layer structure 106a, the tunnel barrier layer 110, the free layer 120, the insulation barrier layer 122 and the vertical polarizer structure 162 sequentially stacked on the substrate 10. In example embodiments, the pinned layer structure 106a may include a lower pinned layer 100a, the spacer 102 and an upper pinned layer 104a sequentially stacked. In example embodiments, the layers of the pinned layer structure 106a may be substantially sequentially stacked in a reverse order to the layers of the pinned layer structure 106 in FIG. 1.

Each of the lower and upper pinned layers 100a and 104a may have a fixed magnetization direction. In example embodiments, the lower and upper pinned layers 100a and 104a may have magnetization directions anti-parallel to each other.

In example embodiments, the magnetic moment of the upper pinned layer 104a may be greater than the magnetic moment of the lower pinned layer 100a. Thus, the pinned layer structure 106a may have a total magnetic moment in a direction substantially the same as the magnetization direction of the upper pinned layer 104a. In this case, the lower pinned layer 100a may have a fifth thickness d5, and the upper pinned layer 104a may have a sixth thickness d6 greater than the first thickness d5.

Each of the lower and upper pinned layers 100a and 104a may include a material having vertical anisotropy. The spacer 102 may include, e.g., an SAF material.

The tunnel barrier layer 110, the free layer 120, and the insulation barrier layer 122 may be substantially the same as the tunnel barrier layer 110, the free layer 120, and the insulation barrier layer 122, respectively, in FIG. 1.

The vertical polarizer structure 162 may be formed on the insulation barrier layer 122. For example, the insulation barrier layer 122 may be formed between the vertical polarizer structure 162 and the free layer 120.

The vertical polarizer structure 162 may include a plurality of magnetization multi-layered structures, e.g., first and second magnetization multi-layered structures 134a and 140a sequentially stacked. The first magnetization multi-layered structure 134a may include a first magnetic layer 130a and a first non-magnetic layer 132a sequentially stacked. The second magnetization multi-layered structure 140a may include a second magnetic layer 136a and a second non-magnetic layer 138a sequentially stacked. The magnetic layer of one of the magnetization multi-layered structures may have a thickness greater than thicknesses of the magnetic layers of the other ones of the magnetization multi-layered structures.

In example embodiments, when the magnetization direction of the upper pinned layer 104a directly contacting the tunnel barrier layer 110 is different from the magnetization direction of the total pinned layer structure 106a, the magnetic layer of one of the magnetization multi-layered structures at an odd-numbered level from the insulation barrier layer 122 may have a thickness grater than thicknesses of the magnetic layers of the other ones of the magnetization multi-layered structures.

Alternatively, when the magnetization direction of the upper pinned layer 104a directly contacting the tunnel barrier layer 110 is the same as a magnetization direction of the total pinned layer structure 106a, the magnetic layer of one of the magnetization multi-layered structures at an even-numbered level from the insulation barrier layer 122 may have a thickness grater than thicknesses of the magnetic layers of the other ones of the magnetization multi-layered structures.

As shown in FIG. 4, the thickness of the upper pinned layer 104a may be greater than a thickness of the lower pinned layer 100a. In this case, the magnetization direction of the total pinned layer structure 106a may be the same as the magnetization direction of the upper pinned layer 104a. Thus, the magnetization direction of the upper pinned layer 104a directly contacting the tunnel barrier layer 110 may be same as the magnetization direction of the total pinned layer structure 106a. The magnetic layer of the one of the magnetization multi-layered structures at an even-numbered level from the insulation barrier layer 122 may have a thickness grater than thicknesses of the magnetic layers of the other ones of the magnetization multi-layered structures.

In example embodiments, as shown in FIG. 4, the vertical polarizer structure 162 may have the first and second magnetization multi-layered structures 134a and 140a. In this case, the first magnetic layer 130a of the first magnetization multi-layered structure 134a may have a seventh thickness d7, and the second magnetic layer 136a of the second magnetization multi-layered structure 140a may have an eighth thickness d8 greater than the third thickness d7.

In example embodiments, as shown in FIG. 5, the vertical polarizer structure 162a may have the first magnetization multi-layered structure 134a, the second magnetization multi-layered structure 140a, a third magnetization multi-layered structure 146a and a fourth magnetization multi-layered structure 152a sequentially stacked. In this case, the second magnetic layer 136a or a fourth magnetic layer 148a of the magnetization multi-layered structures at even-numbered levels from the insulation barrier layer 122 may have a thickness greater than thicknesses of the magnetic layers of the other ones of the magnetization multi-layered structures. For example, the fourth magnetic layer 148a may have a thickness greater than thicknesses of the first, second and third magnetic layers 130a, 136a and 142a, respectively.

Figure 6A:
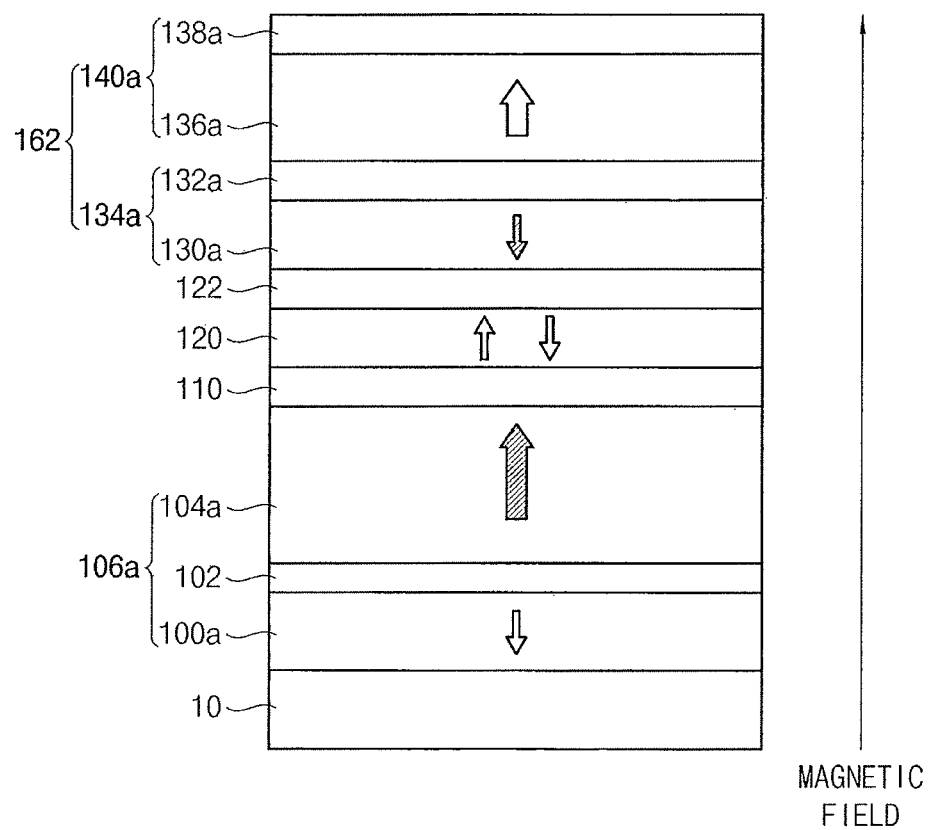
FIGS. 6A and 6B illustrate examples of magnetization directions of layers in the MTJ structure in FIG. 4 according to magnetic moment alignment.
Figure 6B:
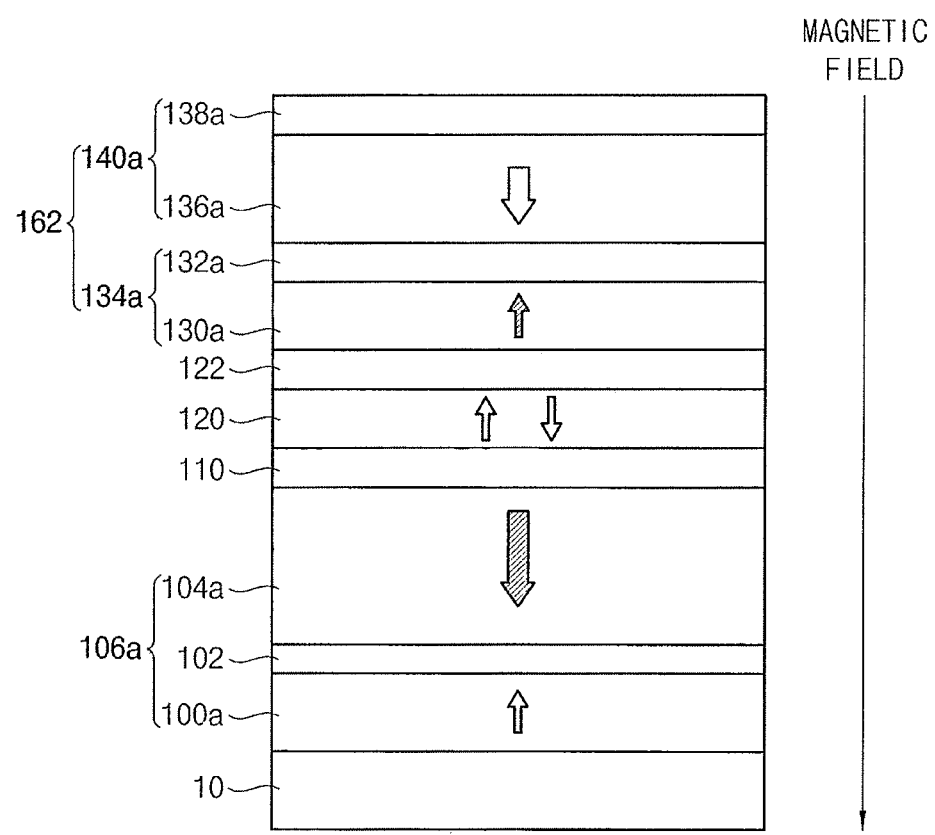
Figure 6C:
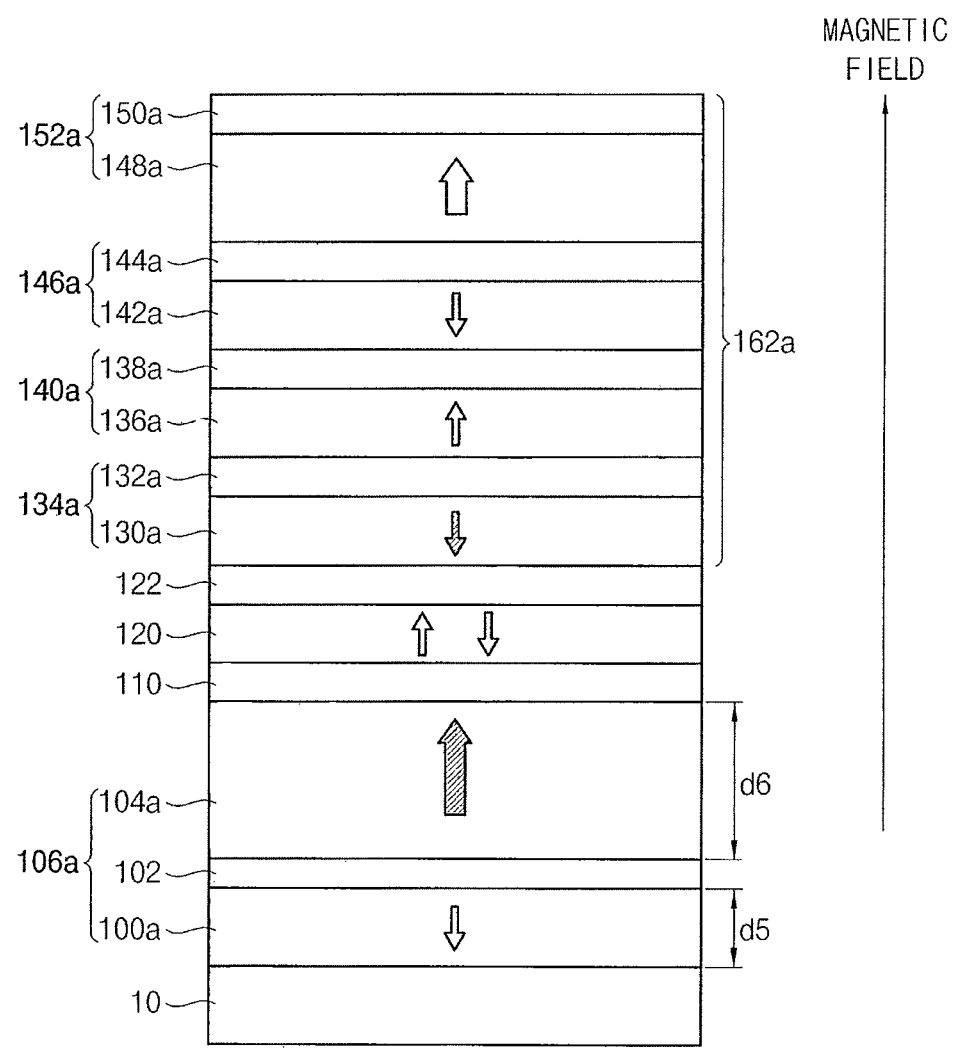
FIG. 6C illustrates an example of magnetization directions of layers in the MTJ structure in FIG. 5 according to magnetic moment alignment.

FIG. 6A illustrates an example of magnetization directions of the layers in the MTJ structure in FIG. 4 according to magnetic moment alignment. FIG. 6B illustrates another example of magnetization directions of the layers in the MTJ structure in FIG. 4 according to magnetic moment alignment. FIG. 6C shows an example of magnetization directions of the layers in the MTJ structure in FIG. 5 according to magnetic moment alignment.

Referring to FIG. 6A, a magnetic field may be applied to the MTJ structure of FIG. 4 in the first direction with heat, so that the magnetic moment of the MTJ structure may be aligned. An external magnetic field may be applied to the vertical polarizer structure 162 from the pinned layer structure 106a in the MTJ structure. Thus, the magnetization direction of the upper pinned layer 104a having the greatest thickness in the pinned layer structure 106a may be determined as the first direction. Thus, the magnetization direction of the lower pinned layer 100a may be determined as the second direction.

In the vertical polarizer structure 162, the second magnetic layer 136a may have the greatest thickness, so that the magnetization direction of the second magnetic layer 136a may be determined as the first direction. Thus, the magnetization direction of the first magnetic layer 130a may be determined as the second direction.

Thus, the upper pinned layer 104a and the first magnetic layer 130a adjacent to the free layer 120 may have magnetization directions anti-parallel to each other.

Referring to FIG. 6B, a magnetic field may be applied to the MTJ structure of FIG. 4 in the second direction with heat, so that the magnetic moment of the MTJ structure may be aligned. An external magnetic field may be applied to the pinned layer structure 106a from the vertical polarizer structure 162 in the MTJ structure. Thus, the magnetization direction of the upper pinned layer 104a in the pinned layer structure 106a may be determined as the second direction. Thus, the magnetization direction of the lower pinned layer 100a may be determined as the first direction.

In the vertical polarizer structure, the magnetization direction of the second magnetic layer 136a may be determined as the second direction. Thus, the magnetization direction of the first magnetic layer 130a may be determined as the first direction.

Thus, the upper pinned layer 104a and the first magnetic layer 130a adjacent to the free layer 120 may have magnetization directions anti-parallel to each other.

Referring to FIG. 6C, a magnetic field may be applied to the MTJ structure of FIG. 5 in the second direction with heat, so that the magnetic moment of the MTJ structure may be aligned. An external magnetic field may be applied to the vertical polarizer structure 162a from the pinned layer structure 106a in the MTJ structure. Thus, the magnetization direction of the upper pinned layer 104a having the greatest thickness in the pinned layer structure 106a may be determined as the first direction. Also, in the vertical polarizer structure, the fourth magnetic layer 148a in the fourth magnetization multi-layered structure 152a may have the greatest thickness so that the magnetization direction of the fourth magnetic layer 148a may be determined as the first direction. Thus, the magnetization directions of the magnetization multi-layered structures at even-numbered levels from the insulation barrier layer 122 may be determined as the first direction, and the magnetization directions of the magnetization multi-layered structures at odd-numbered levels from the insulation barrier layer 122 may be determined as the second direction.

Thus, the upper pinned layer 104a and the first magnetic layer 130a adjacent to the free layer 120 may have magnetization directions anti-parallel to each other.

Figure 7:
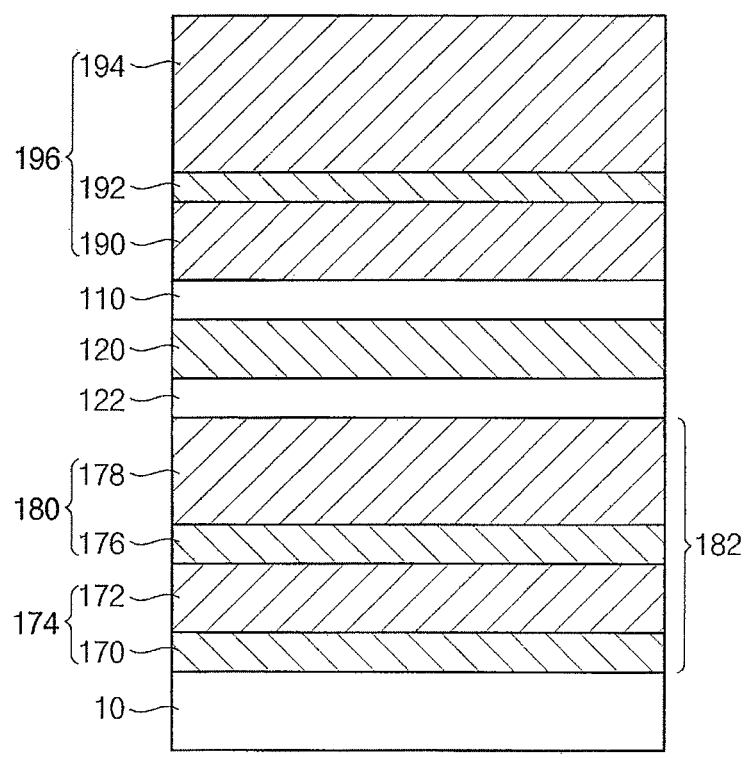
FIG. 7 illustrates another embodiment of an MTJ structure.

FIG. 7 illustrates a cross-sectional view of another embodiment of an MTJ structure which may include a vertical polarizer structure 182, the insulation barrier layer 122, the free layer 120, the tunnel barrier layer 110 and a pinned layer structure 196 sequentially stacked on the substrate 10. In example embodiments, the layers of the MTJ structure may be sequentially stacked in a reverse order to the layers of the MTJ structure in FIG. 1.

The vertical polarizer structure 182 may include a plurality of magnetization multi-layered structures, e.g., first and second magnetization multi-layered structures 174 and 180 sequentially stacked. The first magnetization multi-layered structure 174 may include a first non-magnetic layer 170 and a first magnetic layer 172 sequentially stacked. The second magnetization multi-layered structure 180 may include a second non-magnetic layer 176 and a second magnetic layer 178 sequentially stacked. The magnetic layer of one of the magnetization multi-layered structures may have a thickness greater than thicknesses of the magnetic layers of the other ones of the magnetization multi-layered structures.

The insulation barrier layer 122 may directly contact the magnetic layer of the vertical polarizer structure 182.

In example embodiments, the pinned layer structure 196 may include a lower pinned layer 190, a spacer 192 and an upper pinned layer 194 stacked. In example embodiments, the magnetic moment of the upper pinned layer 194 may be greater than a magnetic moment of the lower pinned layer 190. In this case, the upper pinned layer 194 may have a thickness greater than a thickness of the lower pinned layer 190.

In example embodiments, when the magnetization direction of the pinned layer 190 directly contacting the tunnel barrier layer 110 is different from a magnetization direction of the total pinned layer structure 196, the magnetic layer of one of the magnetization multi-layered structures at an odd-numbered level from the insulation barrier layer 122 may have a thickness greater than thicknesses of the magnetic layers of the other ones of the magnetization multi-layered structures.

Alternatively, when the magnetization direction of the pinned layer 190 directly contacting the tunnel barrier layer 110 is the same as a magnetization direction of the total pinned layer structure 196, the magnetic layer of one of the magnetization multi-layered structures at an even-numbered level from the insulation barrier layer 122 may have a thickness greater than thicknesses of the magnetic layers of the other ones of the magnetization multi-layered structures.

As shown in FIG. 7, the thickness of the upper pinned layer 194 may be greater than the thickness of the lower pinned layer 190. In this case, the magnetization direction of the total pinned layer structure 196 may be the same as the magnetization direction of the upper pinned layer 194. Thus, the magnetization direction of the lower pinned layer 190 directly contacting the tunnel barrier layer 110 may be different from the magnetization direction of the total pinned layer structure 196. The magnetic layer of one of the magnetization multi-layered structures at an odd-numbered level from the insulation barrier layer 122 may have a thickness greater than thicknesses of the magnetic layers of the other ones of the magnetization multi-layered structures.

In example embodiments, the vertical polarizer structure 182 may have the first and second magnetization multi-layered structures 174 and 180. In this case, the second magnetic layer 178 of the second magnetization multi-layered structure 180 may have a thickness greater than a thickness of the first magnetic layer 172 of the first magnetization multi-layered structure 174. Thus, the upper pinned layer 194 and the second magnetic layer 178 adjacent to the free layer 120 may have magnetization directions anti-parallel to each other.

Figure 8A:
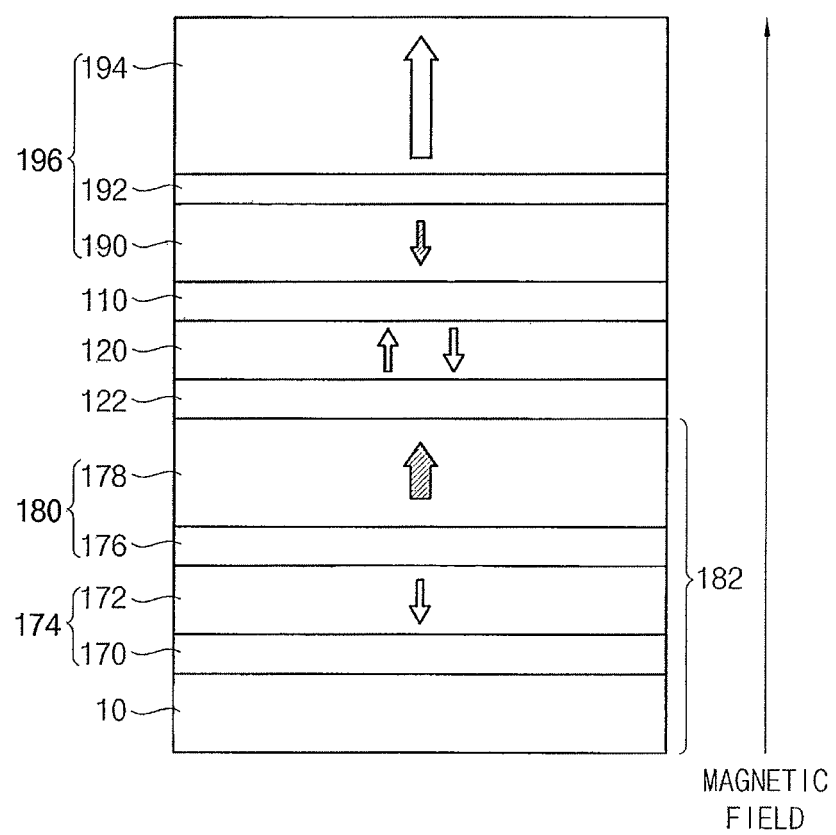
FIGS. 8A and 8B illustrate examples of magnetization directions of layers in the MTJ structure in FIG. 7 according to magnetic moment alignment thereof.
Figure 8B:
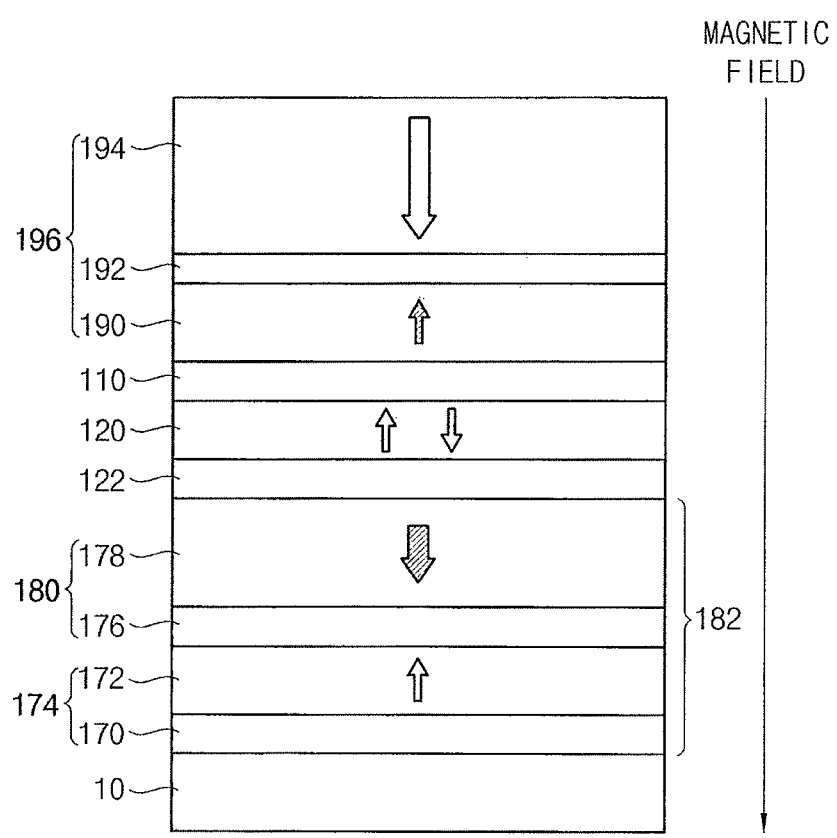

FIG. 8A illustrates an example of magnetization directions of the layers in the MTJ structure in FIG. 7 according to magnetic moment alignment. FIG. 8B illustrates another example of magnetization directions of the layers in the MTJ structure in FIG. 7 according to magnetic moment alignment.

Referring to FIG. 8A, a magnetic field may be applied to the MTJ structure of FIG. 7 in the first direction with heat, so that the magnetic moment of the MTJ structure may be aligned. An external magnetic field may be applied to the pinned layer structure 196 from the vertical polarizer structure 182 in the MTJ structure.

In the vertical polarizer structure 182, the second magnetic layer 178 of the second magnetization multi-layered structure 180 may have the greatest thickness, so that the magnetization direction of the second magnetic layer 178 may be determined as the first direction. Thus, the magnetization direction of the first magnetic layer 172 may be determined as the second direction.

The magnetization direction of the upper pinned layer 194 having the greatest thickness in the pinned layer structure 196 may be determined as the first direction. Thus, the magnetization direction of the lower pinned layer 190 may be determined as the second direction Thus, the lower pinned layer 190 and the second magnetic layer 178 adjacent to the free layer 120 may have magnetization directions, respectively, that may be anti-parallel to each other.

Referring to FIG. 8B, a magnetic field may be applied to the MTJ structure of FIG. 7 in the second direction with heat, so that the magnetic moment of the MTJ structure may be aligned. The direction of an external magnetic field may be the second direction, which may be anti-parallel to the first direction. Thus, the magnetization direction of each of the layers in MTJ structure may be a reversed direction of the magnetization direction of each of the layers in the MTJ structure illustrated with reference to FIG. 8A.

Figure 9:
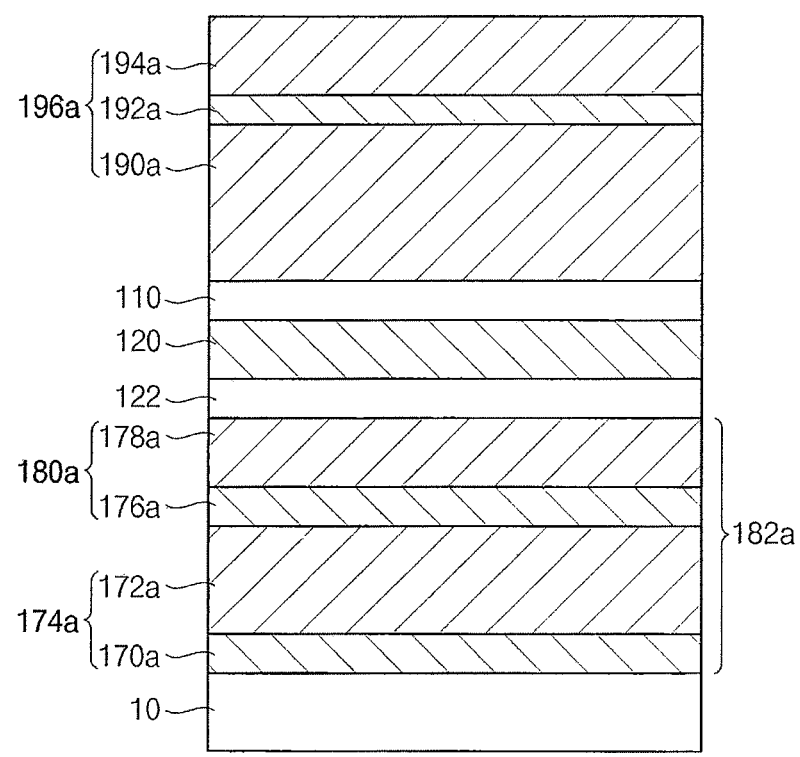
FIG. 9 illustrates another embodiment of an MTJ structure.

FIG. 9 illustrates a cross-sectional view of another embodiment of an MTJ structure which may include a vertical polarizer structure 182a, the insulation barrier layer 122, the free layer 120, the tunnel barrier layer 110 and a pinned layer structure 196a sequentially stacked on the substrate 10.

In example embodiments, the layers of the MTJ structure may be sequentially stacked in a reverse order to the layers of the MTJ structure shown in FIG. 4.

The vertical polarizer structure 182a may include a plurality of magnetization multi-layered structures, e.g., first and second magnetization multi-layered structures 174a and 180a sequentially stacked. The first magnetization multi-layered structures 174a may include a first non-magnetic layer 170a and a first magnetic layer 172a sequentially stacked. The second magnetization multi-layered structures 180a may include a second non-magnetic layer 176a and a second magnetic layer 178a sequentially stacked. The magnetic layer of one of the magnetization multi-layered structures may have a thickness greater than thicknesses of the magnetic layers of the other ones of the magnetization multi-layered structures.

The insulation barrier layer 122 may directly contact an uppermost one, e.g., 178a of the magnetic layers of the vertical polarizer structure 182a.

In example embodiments, the pinned layer structure 196a may include a lower pinned layer 190a, a spacer 192a and an upper pinned layer 194a sequentially stacked.

In example embodiments, the magnetic moment of the lower pinned layer 190a may be greater than the magnetic moment of the upper pinned layer 194a. In this case, the lower pinned layer 190a may have a thickness greater than a thickness of the upper pinned layer 194a.

In example embodiments, when the magnetization direction of the pinned layer 190a directly contacting the tunnel barrier layer 110 is different from a magnetization direction of the total pinned layer structure 196a, the magnetic layer of one of the magnetization multi-layered structures at an odd-numbered level from the insulation barrier layer 122 may have a thickness greater than a thickness of the magnetic layers of the other ones of the magnetization multi-layered structures.

Alternatively, when the magnetization direction of the pinned layer 190a directly contacting the tunnel barrier layer 110 is the same as a magnetization direction of the total pinned layer structure 196a, the magnetic layer of one of the magnetization multi-layered structures at an even-numbered level from the insulation barrier layer 122 may have a thickness greater than thicknesses of the magnetic layers of the other ones of the magnetization multi-layered structures.

As shown in FIG. 9, the thickness of the lower pinned layer 190a may be greater than the thickness of the upper pinned layer 194a. In this case, the magnetization direction of the total pinned layer structure 196a may be the same as a magnetization direction of the lower pinned layer 190a.

The lower pinned layer 190a may directly conduct the tunnel barrier layer 110, so that the magnetic layer of one of the magnetization multi-layered structures at an even-numbered level from the insulation barrier layer 122 may have a thickness greater than thicknesses of the magnetic layers of the other ones of the magnetization multi-layered structures.

In example embodiments, the vertical polarizer structure 182a may have the first and second magnetization multi-layered structures 174a and 180a. In this case, the first magnetic layer 172a of the first magnetization multi-layered structure 174a may have a thickness greater than a thickness of the second magnetic layer 178a of the second magnetization multi-layered structure 180a. Thus, the lower pinned layer 190a and the second magnetic layer 178a adjacent to the free layer 120 may have magnetization directions anti-parallel to each other.

Figure 10A:
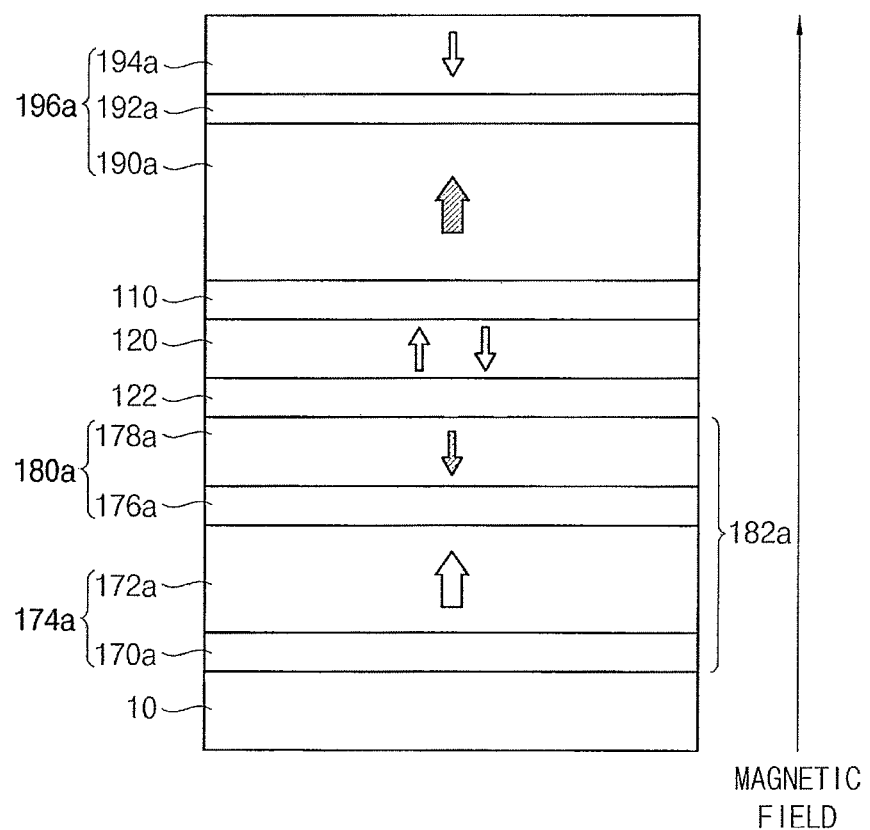
FIGS. 10A and 10B illustrate examples of magnetization directions of layers in the MTJ structure in FIG. 9 according to magnetic moment alignment.
Figure 10B:
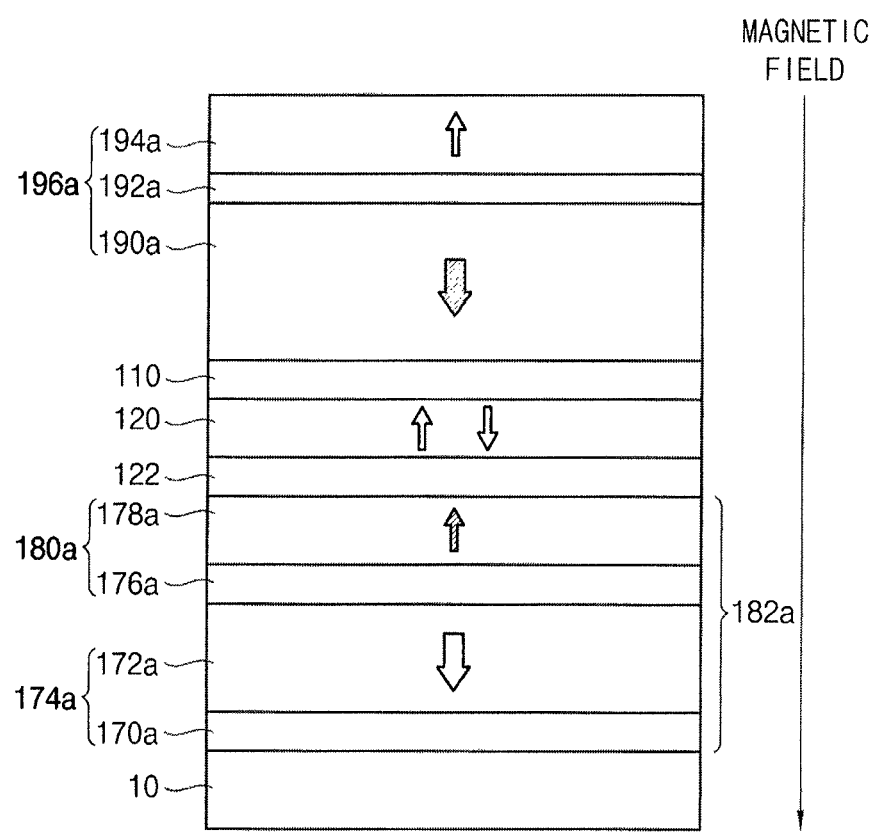

FIG. 10A illustrates an example of magnetization directions of the layers in the MTJ structure in FIG. 9 according to magnetic moment alignment. FIG. 10B illustrates another example of magnetization directions of the layers in the MTJ structure in FIG. 9 according to magnetic moment alignment.

Referring to FIG. 10A, a magnetic field may be applied to the MTJ structure of FIG. 9 in the first direction with heat, so that the magnetic moment of the MTJ structure may be aligned. An external magnetic field may be applied to the pinned layer structure 196a from the vertical polarizer structure 182a in the MTJ structure.

In the vertical polarizer structure, the first magnetic layer 172a may have the greatest thickness, so that the magnetization direction of the first magnetic layer 172a may be determined as the first direction. Thus, the magnetization direction of the second magnetic layer 178a may be determined as the second direction.

In the pinned layer structure, the lower magnetic layer 190a may have the greatest thickness, so that the magnetization direction of the lower magnetic layer 190a may be determined as the first direction. Thus, the magnetization direction of the upper pinned layer 194a may be determined as the second direction Thus, the lower pinned layer 190a and the second magnetic layer 178a adjacent to the free layer 120 may have magnetization directions anti-parallel to each other.

Referring to FIG. 10B, the magnetic field may be applied to the MTJ structure of FIG. 9 in the second direction with heat, so that the magnetic moment of the MTJ structure may be aligned. The direction of an external magnetic field may be the second direction, which may be anti-parallel to the first direction. Thus, the magnetization direction of the layers in MTJ structure may be a reversed direction of the magnetization direction of the layers in the MTJ structure illustrated with reference to FIG. 10A.

Figure 11:
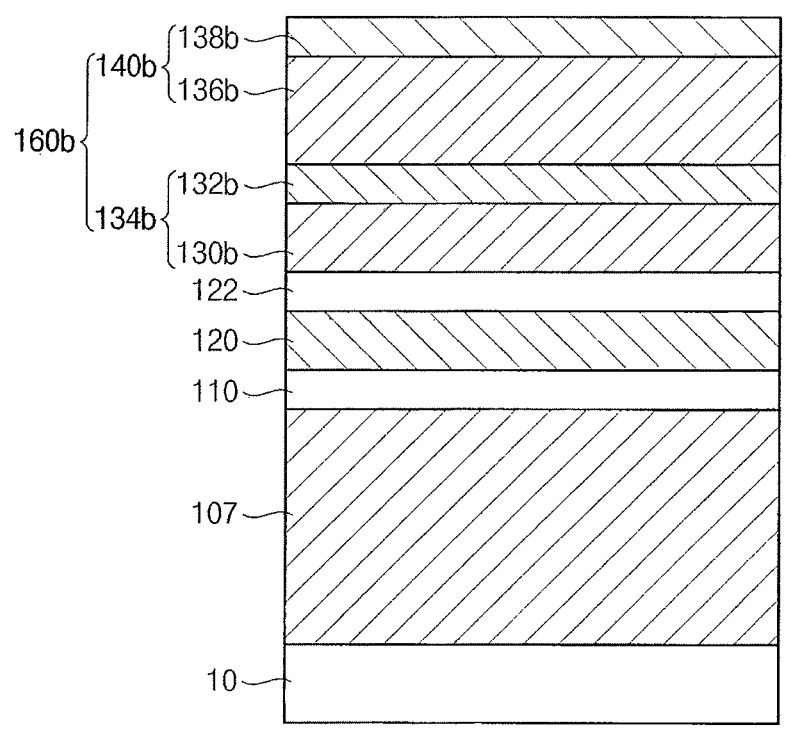
FIG. 11 illustrates another embodiment of an MTJ structure.

FIG. 11 illustrates a cross-sectional view of another embodiment of an MTJ structure which may include a pinned layer 107, the tunnel barrier layer 110, the free layer 120, the insulation barrier layer 122 and a vertical polarizer structure 160b sequentially stacked on the substrate 10. In example embodiments, the pinned layer 107 may include a material having a vertical anisotropy. The pinned layer 107 may have a fixed magnetization direction. The tunnel barrier layer 110, the free layer 120, and the insulation barrier layer 122 may be substantially the same as the tunnel barrier layer 110, the free layer 120, and the insulation barrier layer 122, respectively, in FIG. 1.

The vertical polarizer structure 160b may include a plurality of magnetization multi-layer structures stacked, e.g., first and second magnetization multi-layered structures 134b and 140b sequentially stacked. The first magnetization multi-layered structures 134b may include a first magnetic layer 130b and a first non-magnetic layer 132b sequentially stacked. The second magnetization multi-layered structures 140b may include a second magnetic layer 136b and a second non-magnetic layer 138b sequentially stacked. The magnetic layer of one of the magnetization multi-layered structures may have a thickness greater than thicknesses of the magnetic layers of the other ones of the magnetization multi-layered structures.

In order to increase efficiency of spin-torque of the free layer 120, the magnetic layer 130b and the pinned layer 107 adjacent to the free layer 120 may have magnetization directions anti-parallel to each other. Thus, the magnetic layer 130b directly contacting the insulation barrier layer 122 and the pinned layer 107 may have magnetization directions anti-parallel to each other. Thus, the magnetic layer of one of the magnetization multi-layered structures at an even-numbered level from the insulation barrier layer 122 may have a thickness greater than thicknesses of the magnetic layers of the other one of the magnetization multi-layered structure.

In example embodiments, the vertical polarizer structure 160b may have first and second magnetization multi-layered structures 134b and 140b. In this case, the second magnetic layer 136b of the second magnetization multi-layered structure 140b may have a thickness greater than a thickness of the first magnetic layer 130b of the first magnetization multi-layered structure 134b.

Figure 12A:
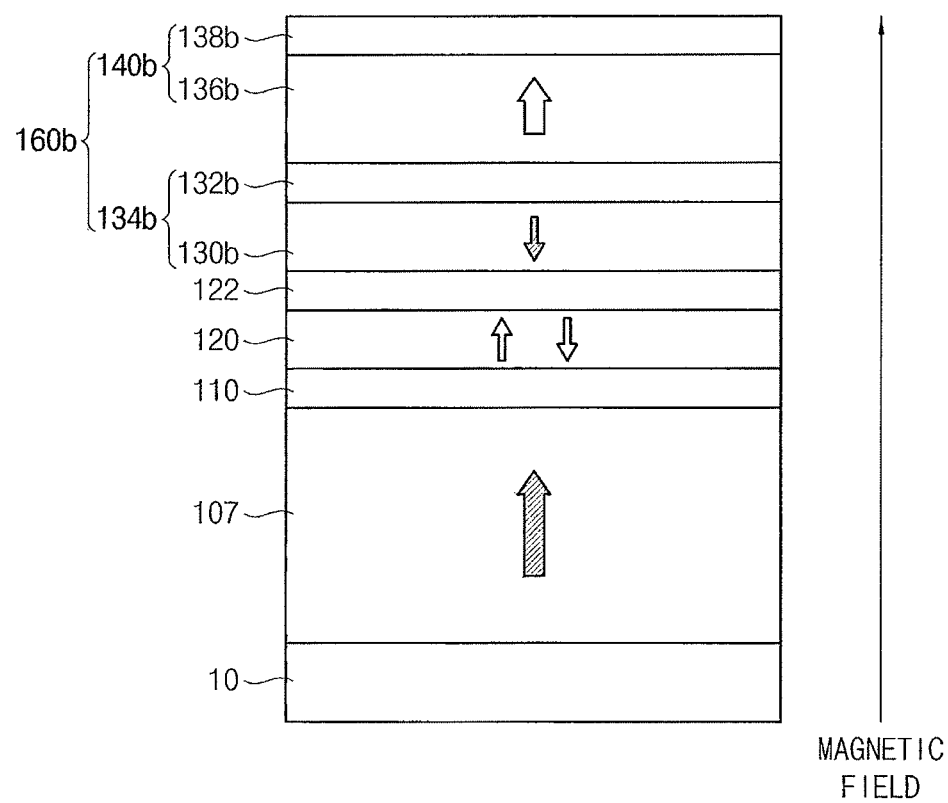
FIGS. 12A and 12B illustrate examples of magnetization directions of layers in the MTJ structure in FIG. 11 according to magnetic moment alignment.
Figure 12B:
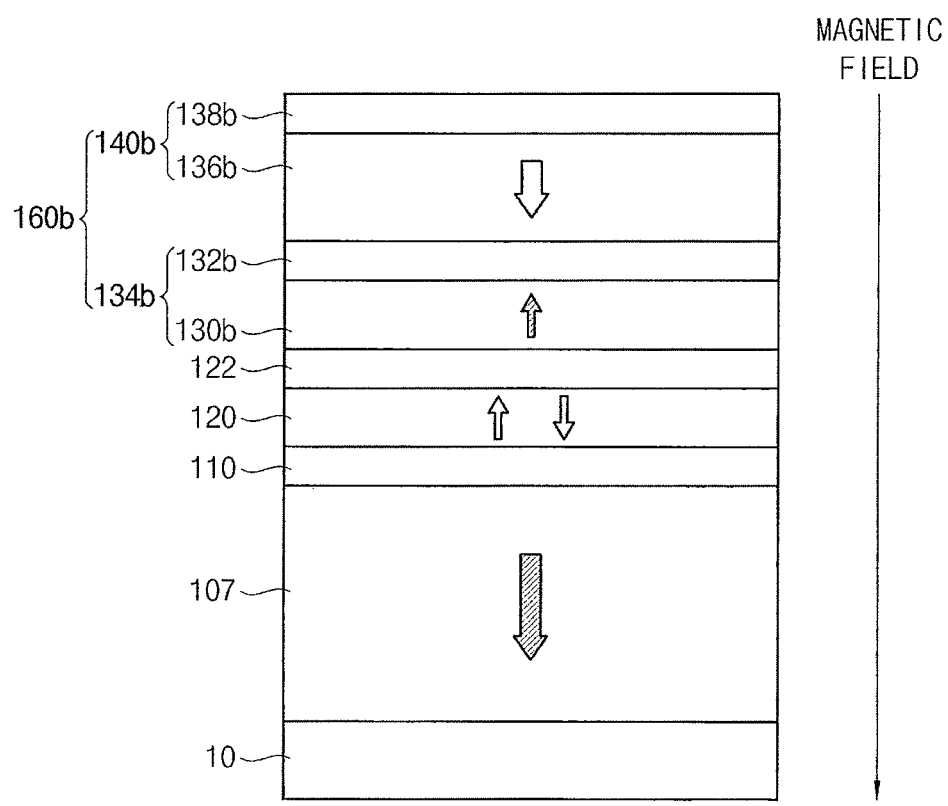

FIG. 12A illustrates an example of magnetization directions of the layers in the MTJ structure in FIG. 11 according to magnetic moment alignment. FIG. 12B illustrates another example of magnetization directions of the layers in the MTJ structure in FIG. 11 according to magnetic moment alignment.

Referring to FIG. 12A, a magnetic field may be applied to the MTJ structure of FIG. 11 in the first direction with heat, so that the magnetic moment of the MTJ structure may be aligned. An external magnetic field may be applied to the vertical polarizer structure 160b from the pinned layer 107 in the MTJ structure.

The magnetization direction of the pinned layer 107 may be determined as the first direction. In the vertical polarizer structure 160b, the second magnetic layer 136b may have the greatest thickness, so that the magnetization direction of the second magnetic layer 136b may be determined as the first direction. Thus, the magnetization direction of the first magnetic layer 130b may be determined as the second direction.

Thus, the pinned layer 107 and the first magnetic layer 130b adjacent to the free layer 120 may have magnetization directions anti-parallel to each other.

Referring to FIG. 12B, a magnetic field may be applied to the MTJ structure of FIG. 11 in the second direction with heat, so that the magnetic moment of the MTJ structure may be aligned. The direction of an external magnetic field may be the second direction, which may be anti-parallel to the first direction. Thus, the magnetization direction of the layers in MTJ structure may be a reversed direction of the magnetization direction of the layers in the MTJ structure illustrated with reference to FIG. 12A.

Figure 13:
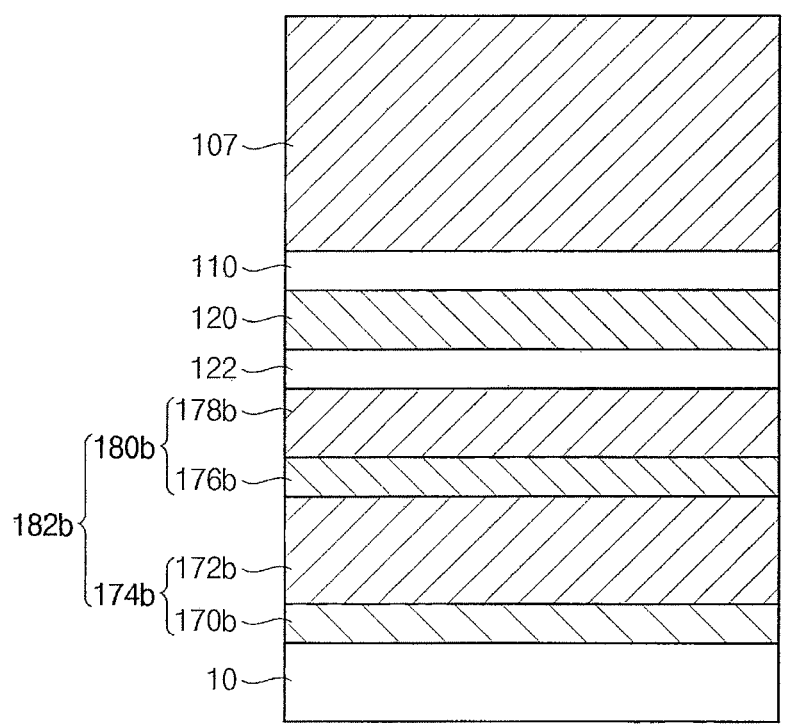
FIG. 13 illustrates another embodiment of an MTJ structure.

FIG. 13 illustrates a cross-sectional view of an MTJ structure which may include a vertical polarizer structure 182b, the insulation barrier layer 122, the free layer 120, the tunnel barrier layer 110, and a pinned layer 107 sequentially stacked on substrate 10. In example embodiments, the layers of the MTJ structure may be substantially stacked in a reverse order to the layers of the MTJ structure in FIG. 11.

The vertical polarizer structure 182b may include a plurality of magnetization multi-layer structures, e.g., first and second magnetization multi-layered structures 174b and 180b sequentially stacked. The first magnetization multi-layered structures 174b may include a first non-magnetic layer 170b and a first magnetic layer 172b sequentially stacked. The second magnetization multi-layered structures 180b may include a second non-magnetic layer 176b and a second magnetic layer 178b sequentially stacked. The magnetic layer of one of the magnetization multi-layered structures may have a thickness greater than thicknesses of the magnetic layers of the other ones of the magnetization multi-layered structures. For example, the magnetic layer of one of the magnetization multi-layered structures at an even-numbered level from the insulation barrier layer 122 may have a thickness greater than a thickness of the magnetic layers of the other ones of the magnetization multi-layered structures.

The insulation barrier layer 122 may directly contact an uppermost one (e.g., 178b) of the magnetic layers of the vertical polarizer structure 182b.

In example embodiments, the pinned layer 107 may include a material having vertical anisotropy. The pinned layer 107 may have a fixed magnetization direction.

In example embodiments, as shown in FIG. 13, the vertical polarizer structure 182b may have first and second magnetization multi-layered structures 174b and 180b. In this case, the first magnetic layer 172b of the first magnetization multi-layered structure 174b may have a thickness greater than a thickness of the second magnetic layer 178b of the second magnetization multi-layered structure 180b.

Figure 14A:
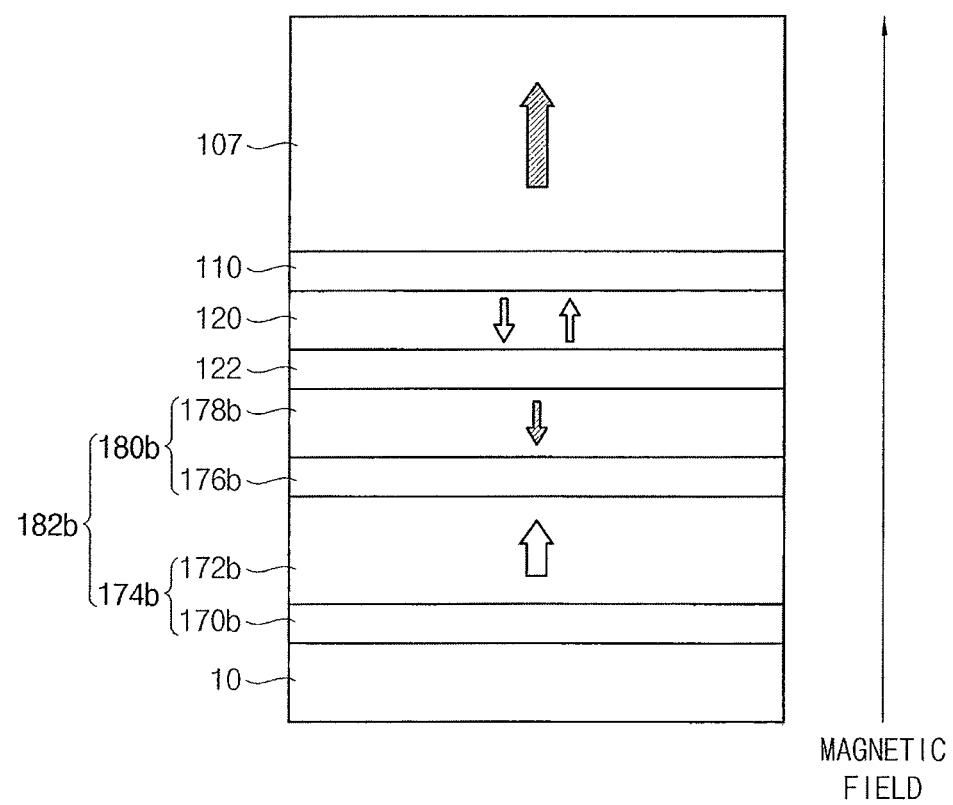
FIGS. 14A and 14B illustrate examples of magnetization directions of layers in the MTJ structure in FIG. 13 according to magnetic moment alignments.
Figure 14B:
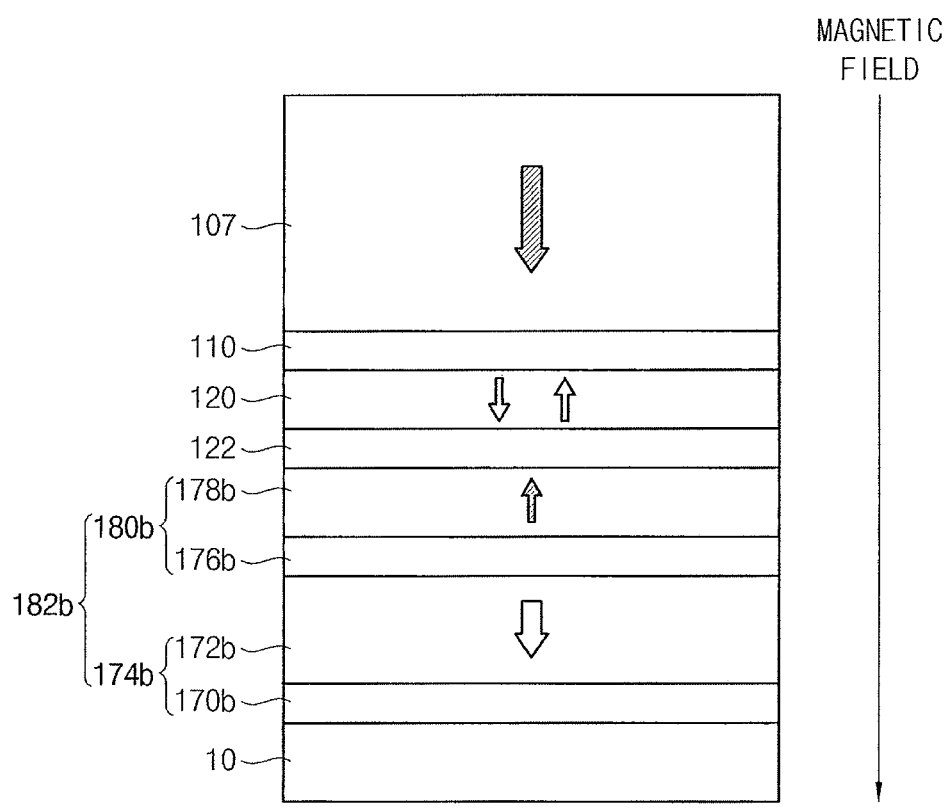

FIGS. 14A and 14B illustrate examples of magnetization directions of the layers in the MTJ structure in FIG. 13 according to magnetic moment alignment. Referring to FIG. 14A, a magnetic field may be applied to the MTJ structure of FIG. 13 in the first direction with heat, so that the magnetic moment of the MTJ structure may be aligned. An external magnetic field may barrier applied to the pinned layer 107 from the vertical polarizer structure 182b in the MTJ structure.

In the vertical polarizer structure, the first magnetic layer 172b may have the greatest thickness, so that the magnetization direction of the first magnetic layer 172b may be determined as the first direction. Thus, the magnetization direction of the second magnetic layer 178b may be determined as the second direction. The magnetization direction of the pinned layer 107 may be determined as the first direction.

Thus, the pinned layer 107 and the second magnetic layer 178b adjacent to the free layer 120 may have magnetization directions anti-parallel to each other.

Referring to FIG. 14B, a magnetic field may be applied to the MTJ structure of FIG. 13 in the second direction with heat, so that the magnetic moment of the MTJ structure may be aligned. The direction of an external magnetic field may be the second direction, which may be anti-parallel to the first direction. Thus, the magnetization direction of the layers in MTJ structure may be a reversed direction of the magnetization direction of the layers in the MTJ structure illustrated with reference to FIG. 14A.

Figure 15:
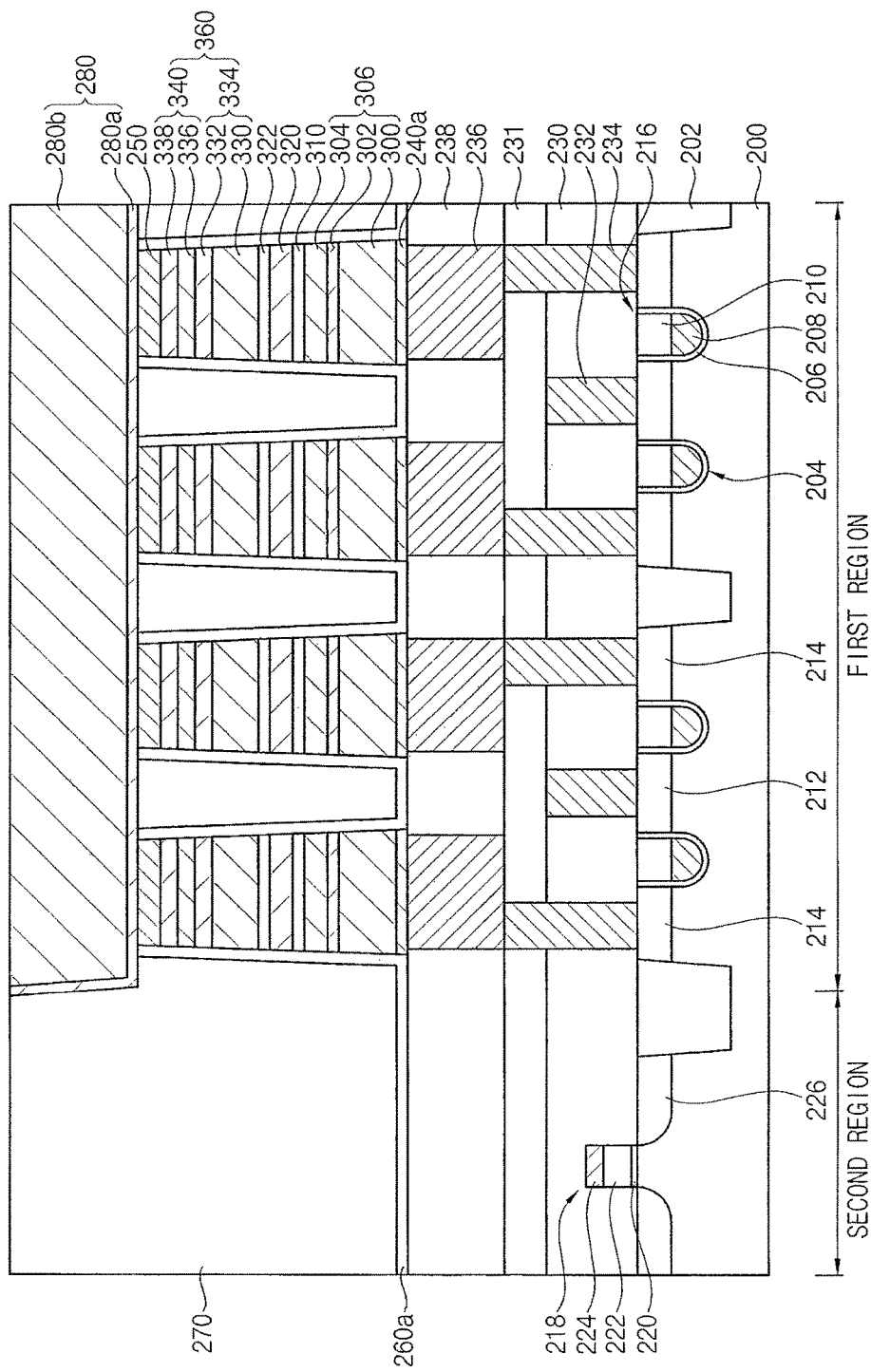
FIG. 15 illustrates an embodiment of an MRAM device.

FIG. 15 illustrates a cross-sectional of an embodiment of an MRAM device which may include a transistor, a wiring structure and an MTJ structure. The transistor may be formed on a substrate 200, and the MTJ structure may be electrically connected to the transistor via the wiring structure.

The substrate 200 may include a semiconductor material, e.g., silicon, germanium, silicon-germanium, or III-V semiconductor compounds. In an example embodiment, the substrate 200 may be a silicon-on-insulator (SOI) substrate or a germanium-on-insulator (GOI) substrate.

The substrate 200 may include a first region and a second region. In example embodiments, the first region may be a cell region including memory cells of the MRAM device. The second region may be a peripheral circuit region including peripheral circuits for operating the memory cells.

An isolation layer 202 may be on the substrate 200 to divide the substrate 200 into an active region and a field region. In example embodiments, a plurality of active regions spaced apart from each other may be arranged in the first region.

A first transistor may be formed on the first region of the substrate 200. In example embodiments, the first transistor may be a buried channel array transistor (BCAT). Thus, the first transistor may include a first gate structure 216 formed in a trench of the substrate 200. The first gate structure 216 may include a first gate insulation pattern 206, a first gate electrode 208, and a first hard mask 210 sequentially stacked. A first impurity region 212 and a second impurity region 214 may be at upper portions of the substrate 200, respectively, adjacent to the first gate structure 216. In example embodiments, two first gate structures 216 may be formed at each of the active regions, so that two first transistors may be formed within each of the active regions. The first impurity region 212 may be formed at a central portion of each of the active regions between the first gate structures 216. The second impurity region 214 may be formed at edge portions of each of the active regions.

The first gate structure 216 may extend in a third direction substantially parallel to an upper surface of the substrate 200. In example embodiments, the first gate electrode 208 may serve as a word line of the MRAM device.

In another embodiment, the first transistor may be may be a planar-type channel array transistor (PCAT) including the first gate structure on the substrate 200. A second transistor may be formed on the second region of the substrate 200 and may correspond to the peripheral circuits. The second transistor may be a PCAT. The second transistor may include a second gate structure 218 including a second gate insulation pattern 220, a second gate electrode 222, and a second hard mask 224 sequentially stacked. A third impurity region 226 may be at an upper portion adjacent to second gate structure 218.

A first insulating interlayer 230 may be formed on the first and second regions of the substrate 200. The first insulating interlayer 230 may sufficiently cover the first and second transistors.

In example embodiments, a source line 232 may extend in the third direction through the first insulating interlayer 230, and may be electrically connected to the first impurity region 212. The source line 232 may include a metal, e.g., tungsten, titanium, tantalum, etc., and/or a metal nitride, e.g., tungsten nitride, titanium nitride, tantalum nitride, etc.

In one embodiment, a contact plug may be formed through the first insulating interlayer 230 on the first impurity region 212. A source line may be formed on the first insulating interlayer 230 and the contact plug.

A second insulating interlayer 231 may be formed on the first insulating interlayer 230, and may cover the source line 232.

Contact plugs 234 may penetrate through the first and second insulating interlayers 230 and 231, and may contact the second impurity regions 214. Each of the contact plugs 234 may include a metal, e.g., tungsten, titanium, tantalum, etc., a metal nitride, e.g., tungsten nitride, titanium nitride, tantalum nitride, etc., and/or doped polysilicon.

Pad patterns 236 may be formed on the contact plugs 234, respectively. Also, an insulation pattern 238 may be formed on the second insulating interlayer 231 between the pad patterns 236. The pad patterns 236 may electrically connect the contact plug 234 to a variable resistance structure, when the contact plug 234 and the variable resistance structure do not directly contact to each other. In some example embodiments, no pad patterns may be formed when the contact plug 234 and the variable resistance structure directly contact to each other.

The variable resistance structure may be formed on the pad pattern 236 and the insulation pattern 238, and may include a lower electrode 240a, an MTJ structure and an upper electrode 250 sequentially stacked.

Each of the lower and upper electrodes 240a and 250 may include a metal, e.g., tungsten, titanium, tantalum, etc., or a metal nitride, e.g., tungsten nitride, titanium nitride, tantalum nitride, etc. A barrier layer may be further formed on the lower electrode 240a.

In example embodiments, the MTJ structure may be substantially the same as or similar to the MTJ structure illustrated with reference to FIG. 1. For example, the MTJ structure may include a pinned layer structure 306, a tunnel barrier pattern 310, a free pattern 320, an insulation barrier pattern 322, and a vertical polarizer structure 360 sequentially stacked.

As illustrated with reference to FIG. 1, in example embodiments, the vertical polarizer structure 360 may have a first magnetization multi-layered structure 334 including a first magnetic layer 330 and a first non-magnetic layer 332 and a second magnetization multi-layered structure 340 including a second magnetic layer 336 and a second non-magnetic layer 338. The vertical polarizer structure 360 may transfer spin-torque to the free layer 320, so that operating currents of the MTJ structure may be decreased.

The MTJ structure of FIG. 15 may have a stacked structure substantially the same as that of the MTJ structure of FIG. 1. In other example embodiments, the MTJ structure may have a stacked structure substantially the same as or similar to that of any MTJ structures illustrated with reference to FIGS. 2, 4, 5, 9, 11, and 13.

An insulation capping pattern 260a may be conformally formed on the MTJ structure and the insulation pattern 238.

An upper insulating interlayer 270 may be formed on the insulation capping pattern 260a, and may cover the MTJ structure. The upper insulating interlayer 270 may include silicon oxide.

A bit line 280 may be formed through the upper insulating interlayer 270, and may contact an upper surface of the upper electrode 250. The bit line 280 may contact a plurality of upper electrodes 250, and extend in a fourth direction substantially perpendicular to the third direction. In example embodiments, a plurality of bit lines 280 may be formed to be parallel to each other.

Each of the bit lines 280 may include a barrier pattern 280a and a metal pattern 280b substantially stacked. The barrier pattern 280a may include a metal, e.g., titanium, tantalum, etc., and/or a metal nitride, e.g., titanium nitride, tantalum nitride, etc. The metal pattern 280b may include, e.g., Cu, W, Al, etc. Top surfaces of the bit lines 280 and the upper insulating interlayer 270 may be substantially coplanar with each other. A third insulating interlayer may be further formed to cover the upper insulating interlayer 270 and the bit lines 280.

Figure 16:
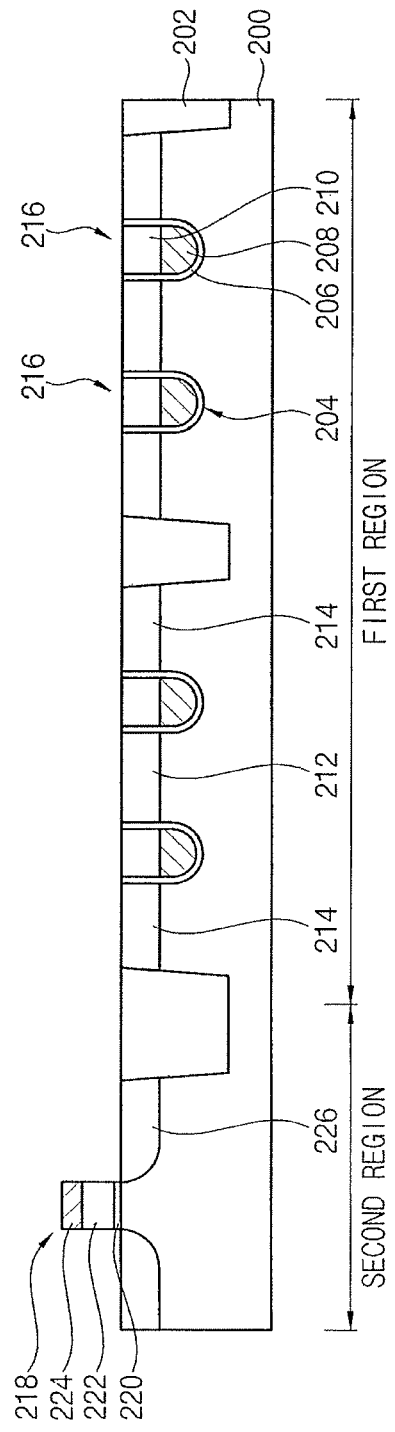
FIGS. 16 to 22 illustrate various stages of an embodiment of a method for manufacturing the MRAM device.

FIGS. 16 to 22 illustrate cross-sectional views of various stages of an embodiment of a method for manufacturing an MRAM device. Referring to FIG. 16, the method includes forming an isolation layer 202 on a substrate 200 so that the substrate 200 is divided into a field region on which the isolation layer 202 is formed and an active region on which no isolation layer is formed. The substrate 200 may include a first region in which memory cells may be formed and a second region in which peripheral circuits may be formed. The isolation layer 202 may be formed by a shallow trench isolation (STI) process. In example embodiments, a plurality of active regions may be formed to be spaced apart from each other.

A plurality of first transistors may be formed on the first region of the substrate 200. Two first transistors may be formed within each of the active regions. In example embodiments, the first transistors may be BCATs. For example, a mask may be formed on the substrate 200. Upper portions of the substrate 200 may be etched using the mask as an etching mask to form trenches 204 extending in the third direction.

Two trenches 204 may be formed within each of the active regions. A first gate structure 216 may be formed in each of the trenches 204. The first gate structure 216 may be formed to include a first gate insulation pattern 206, a first gate electrode 208, and a first hard mask 210 sequentially stacked. Portions of the active region adjacent to the first gate structure 216 may be doped with impurities to form a first impurity region 212 and a second impurity region 214, respectively. The first impurity region 212 may be formed between the first gate structures 216 within each of the active regions, and may serve as a common source region of the two first transistors. The second impurity region 214 may serve as a drain region.

A second transistor may be formed on the second region of the substrate 200. In example embodiments, the second transistor may be a PCAT. For example, a gate insulation layer, a gate electrode layer, and a second hard mask 224 may be sequentially formed on the substrate 200. The gate electrode layer and a gate insulation layer may be etched using the second hard mask 224 as an etching mask to form a second gate structure 218 including a second gate insulation pattern 220, a second gate electrode 222 and the second hard mask 224 sequentially stacked. A portion of the active region adjacent to the second gate electrode 222 may be doped with impurities to form a third impurity region 226. The third impurity region 226 may serve as source/drain regions of the second transistor.

Figure 17:
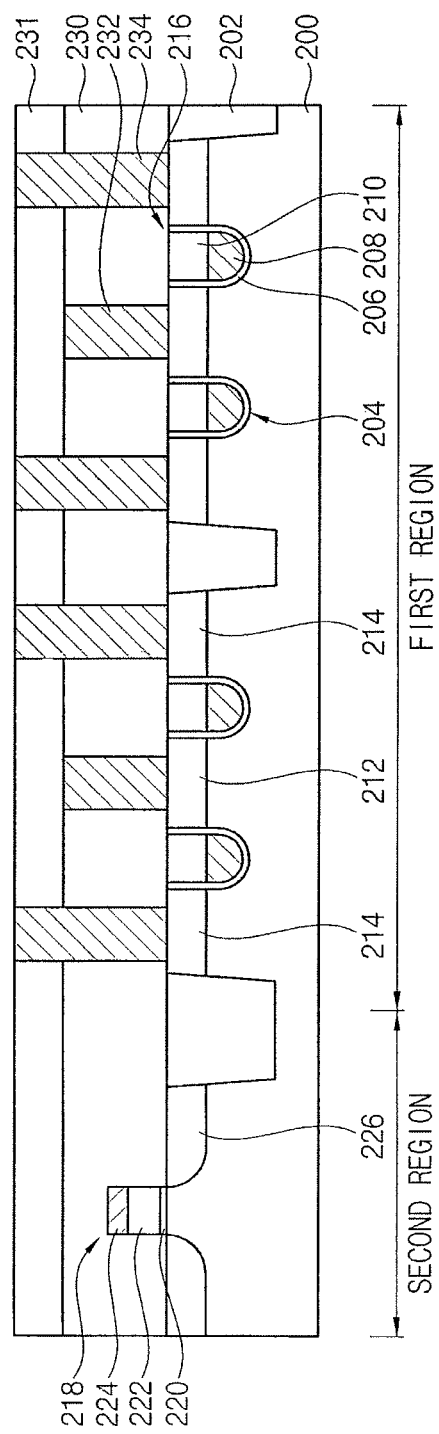

Referring to FIG. 17, a first insulating interlayer 230 may be formed on the first and second regions of the substrate 200 to cover the first and second transistors. The first insulating interlayer 230 may be planarized so that an upper surface of the first insulating interlayer 230 may be flat. In example embodiments, the planarization process may be performed, for example, by a chemical mechanical polishing (CMP) process and/or an etch back process.

A portion of the first insulating interlayer 230 may be etched to form a first opening, which may expose a top surface of the first impurity region 212. The first opening may extend in the third direction.

A first conductive layer may be formed on the first impurity region 212 and the first insulating interlayer 230 to sufficiently fill the first opening. The first conductive layer may be planarized until the upper surface of the first insulating interlayer 230 may be exposed to form a source line 232 contacting the first impurity region 212. The source line 232 may be formed of a metal, e.g., tungsten, titanium, tantalum, etc., and/or a metal nitride, e.g., tungsten nitride, titanium nitride, tantalum nitride, etc.

A second insulating interlayer 231 may be formed on the first insulating interlayer 230 and the source line 232. The first insulating interlayer 230 may have a flat top surface. Thus, the second insulating interlayer 231 may also have a flat top surface. The first and second insulating interlayers 230 and 231 may include, e.g., silicon oxide.

The second and first insulating interlayers 230 and 231 may be partially etched to form a second opening therethrough exposing a top surface of the second impurity region 214. A second conductive layer may be formed on the second impurity region 214 and the second insulating interlayer 231 to sufficiently fill the second opening. The second conductive layer may be planarized until the upper surface of the second insulating interlayer 231 may be exposed to form a contact plug 234 contacting the second impurity region 214. The contact plug 234 may be formed of a metal, e.g., tungsten, titanium, tantalum, etc., and/or a metal nitride, e.g., tungsten nitride, titanium nitride, tantalum nitride, etc.

Figure 18:
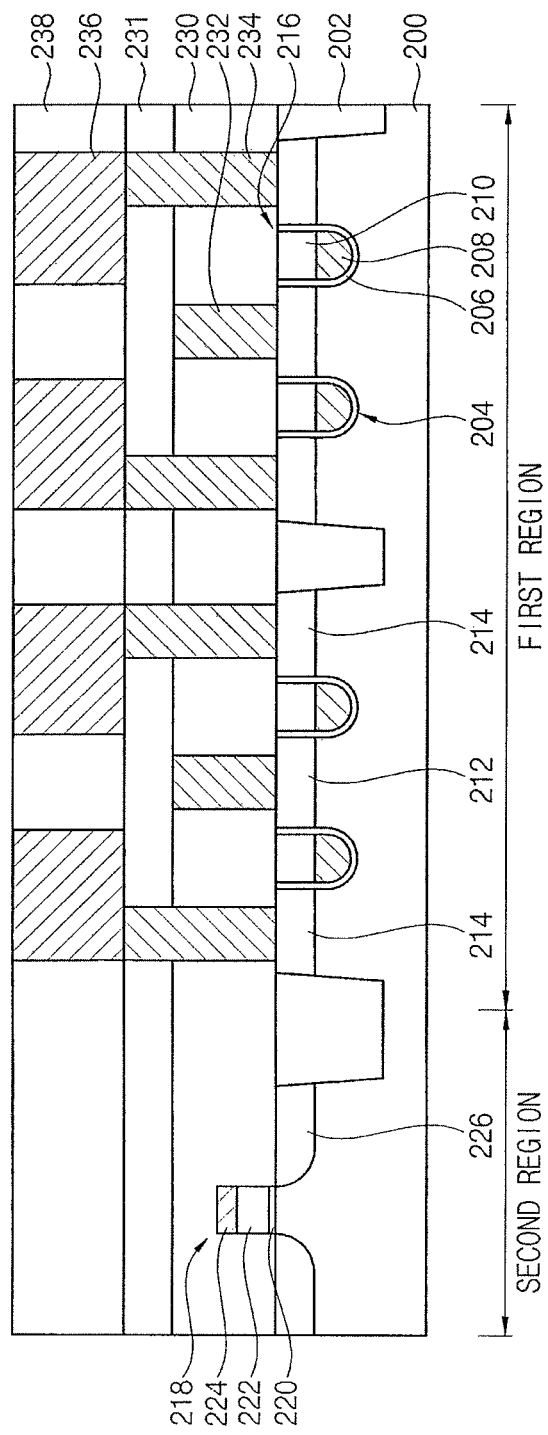

Referring to FIG. 18, a pad layer may be formed on the second insulating interlayer 231 and the contact plugs 234. The pad layer may be formed of a metal, e.g., tungsten, titanium, tantalum, etc., and/or a metal nitride, e.g., tungsten nitride, titanium nitride, tantalum nitride, etc. The pad layer may be patterned to form a pad pattern 236 on each of the contact plugs 234.

An insulation pattern 238 may be formed on the second insulating interlayer 231 to fill a gap between the pad patterns 236. The insulation pattern 238 may include, e.g., silicon nitride or silicon oxide.

In one embodiment, the pad patterns 236 may be formed by a damascene process. Firstly, an insulation pattern 238 may be formed to include an opening that corresponds to a position of each of pad patterns. A pad layer may be formed on the insulation pattern 238 to fill the opening. An upper portion of the pad layer may be planarized until a top surface of the insulation pattern 238 may be exposed to form the pad patterns 236.

Figure 19:
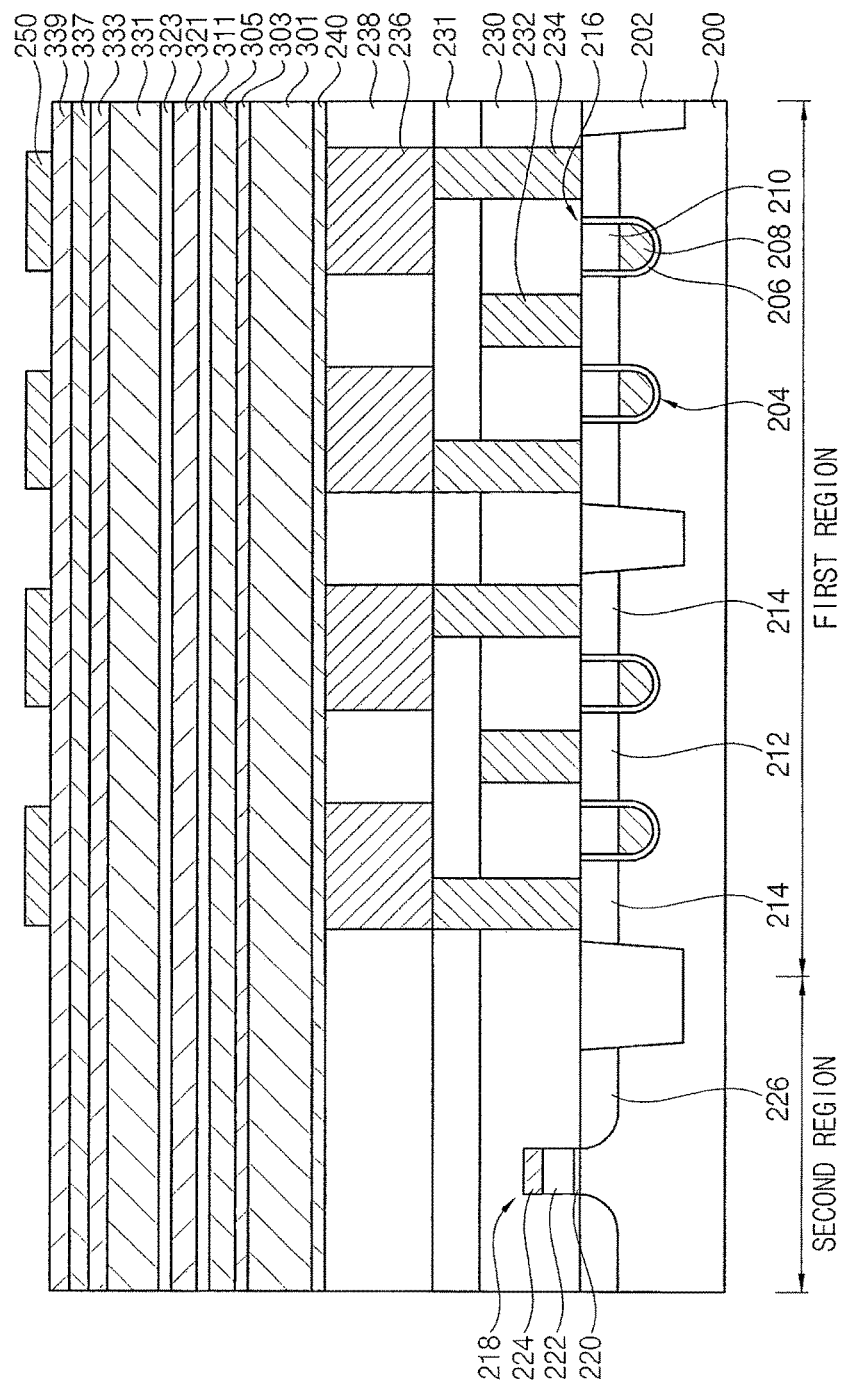

Referring to FIG. 19, a lower electrode layer 240 may be formed on the pad pattern 236 and the insulation pattern 238. Layers for forming an MTJ structure may be sequentially formed on the lower electrode layer 240. In example embodiments, a lower pinned layer 301, a spacer layer 303, an upper pinned layer 305, a tunnel barrier layer 311, a free layer 321, an insulation barrier layer 323, and magnetization multi-layered structures 331, 333, 337 and 339 may be formed on the lower electrode layer 240. An upper electrode 250 may be formed on the uppermost one 339 of the magnetization multi-layered structures.

The lower electrode layer 240 may be formed of a metal, e.g., tungsten, titanium, tantalum, etc., or a metal nitride, e.g., tungsten nitride, titanium nitride, tantalum nitride, etc. The lower electrode layer 240 may be formed by a sputtering process or an atomic layer deposition (ALD) process.

The layers for forming the MTJ structure may be formed to have a stacked structure substantially the same as or similar to that of the MTJ structure of FIG. 1. The layers may be formed, for example, by a sputtering process. In some example embodiments, in the sputtering process, metal targets and/or reaction gases may be changed in a sputtering chamber, according to the layers for forming the MTJ structure. The layers may be formed the sputtering chamber in-situ.

In some example embodiments, the layers for forming the MTJ structure may be formed to have one of the stacked structures of the MTJ structures illustrated with reference to FIGS. 2, 4, 5, 9, 11, and 13.

A plurality of upper electrodes 250 may be formed by forming the upper electrode layer on the uppermost one 339 of the magnetization multi-layered structures, and patterning the upper electrode layer. The upper electrode layer may be formed of a metal, e.g., tungsten, titanium, tantalum, etc., or a metal nitride, e.g., tungsten nitride, titanium nitride, tantalum nitride, etc. The upper electrodes may overlap the pad patterns, respectively.

In example embodiments, an external magnetic field may be applied to layers for forming the MTJ structure with heat, so that a magnetization direction of the layers for forming the MTJ structure may be aligned. In example embodiments, the external magnetic field may be applied in a vertically upward direction from an upper surface of the substrate 200. In this case, the layers for forming the MTJ structure may have magnetization directions substantially the same as magnetization directions in FIG. 3A. In some example embodiments, the external magnetic field may be applied in a vertically downward direction to the upper surface of the substrate 200. In this case, the layers for forming the MTJ structure may have magnetization directions substantially the same as magnetization directions in FIG. 3B.

At least one of the alignment processes may be performed after forming the layers for forming the MTJ structure. For example, the alignment process may or may not be immediately performed after forming the layers for forming the MTJ structure. In example embodiments, at least one of the alignment processes may be performed before packaging the MRAM device.

Figure 20:
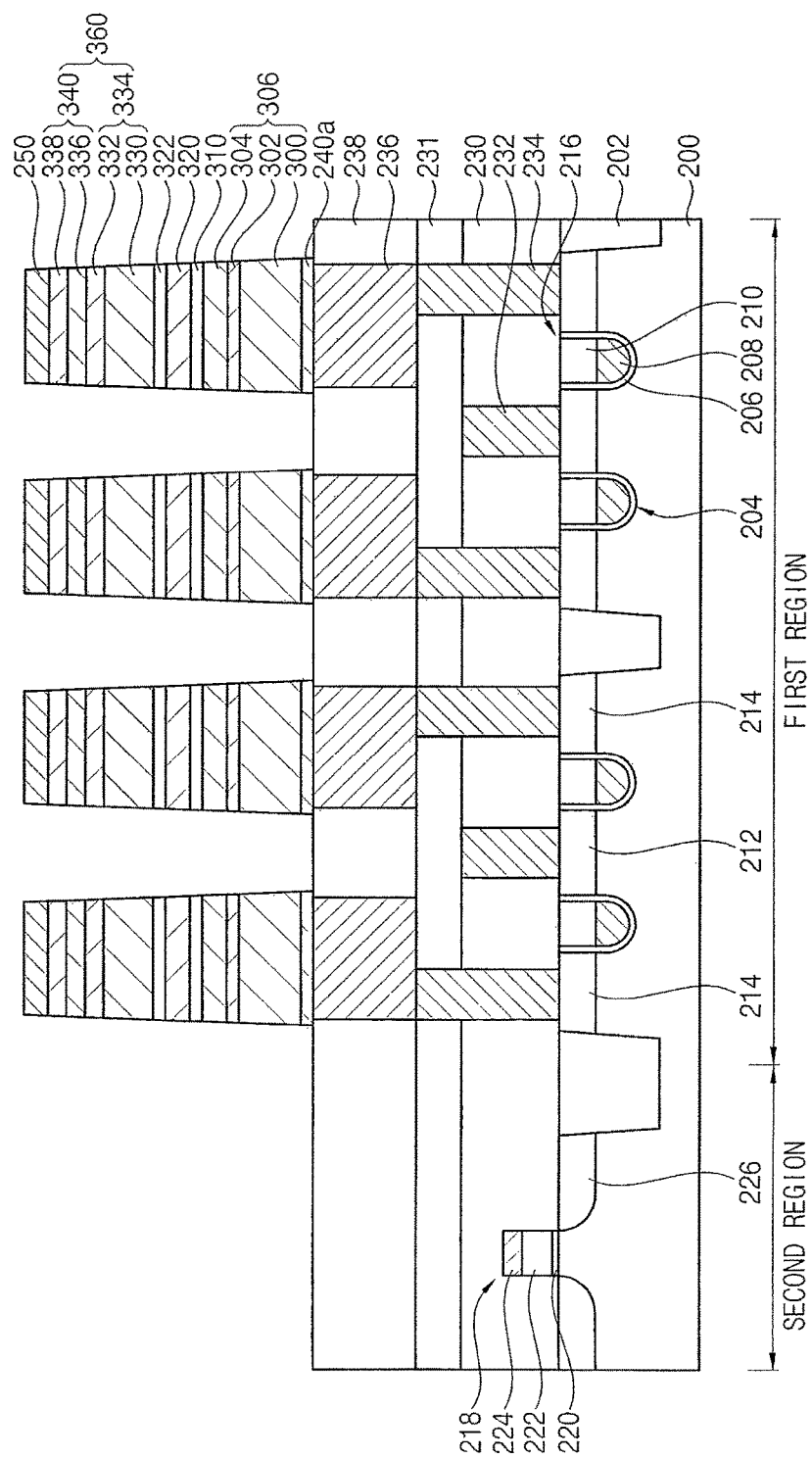

Referring to FIG. 20, the layers for forming the MTJ structure and the lower electrode layer 240 may be sequentially and isotropically etched using the upper electrode 250 as an etching mask. The etching may form a variable resistance structure including a lower electrode 240a, an MTJ structure, and the upper electrode 250 on the pad pattern 236.

The MTJ structure may include a lower pinned pattern 300, a spacer 302, an upper pinned pattern 304, a tunnel barrier pattern 310, a free pattern 320, an insulation barrier pattern 322, and a vertical polarizer structure 360 sequentially stacked. The vertical polarizer structure 360 may include a plurality of magnetization multi-layered structures 334 and 340 sequentially stacked, each of which may include a magnetic layer and a non-magnetic layer sequentially stacked.

In example embodiments, the MTJ structure may have a stacked structure substantially the same as that of the MTJ structure of FIG. 1. In some example embodiments, the layers for forming the MTJ structure may be changed, so that the MTJ structure may be formed to have a stacked structure substantially the same as or similar to one of the stacked structures of the MTJ structures illustrated with reference to FIGS. 2, 4, 5, 9, 11, and 13.

Figure 21:
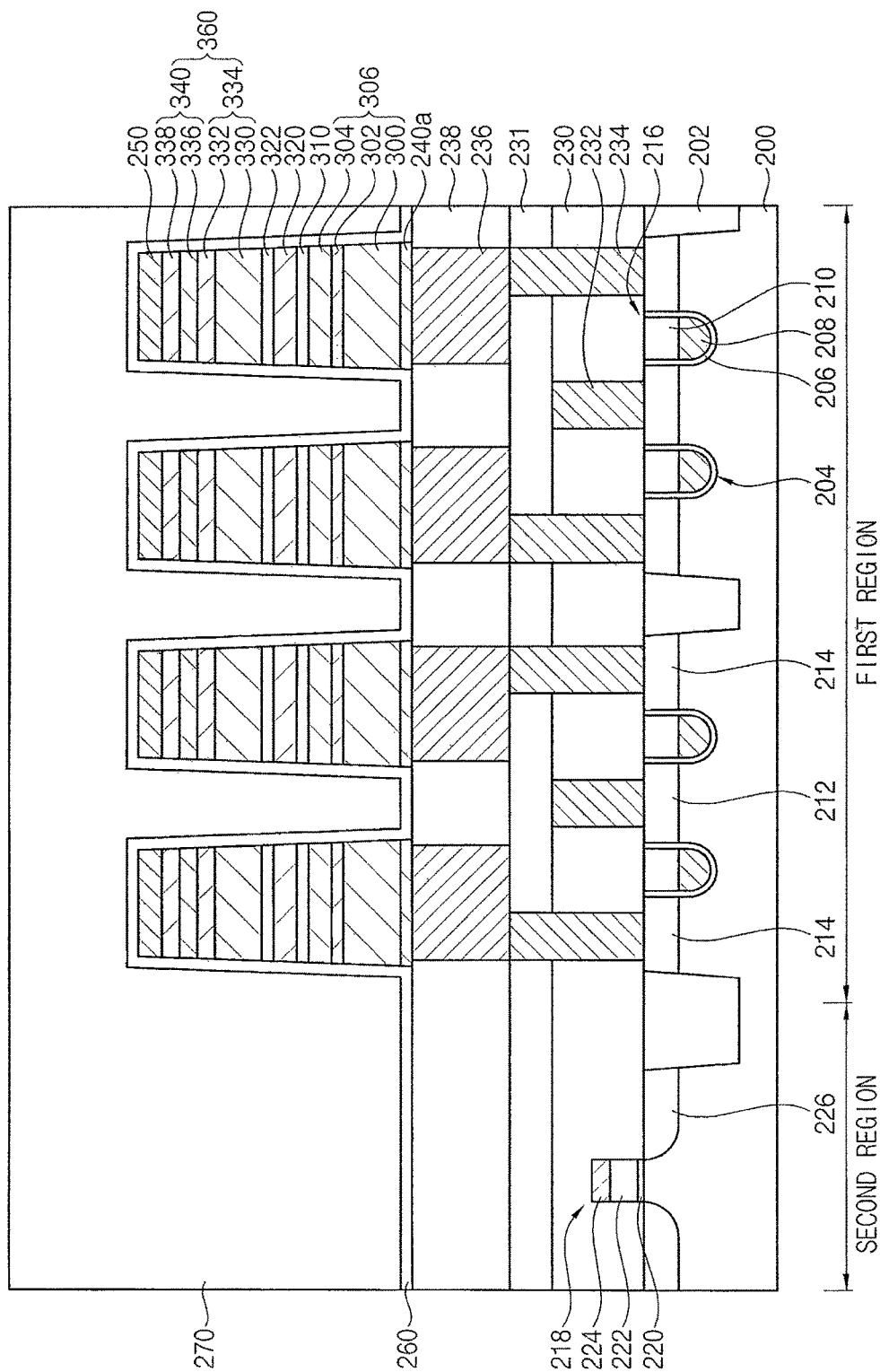

Referring to FIG. 21, an insulation capping layer 260 may be formed on the insulation pattern 238 and the variable resistance structure. An upper insulating interlayer 270 may be formed on the insulation capping layer 260.

An insulation capping layer 260 may be conformally formed on a surface of the variable resistance structure, so as not to completely fill a gap between a plurality of variable resistance structures. The insulation capping layer 260 include, e.g., silicon nitride, silicon oxide, etc.

The upper insulating interlayer 270 may be formed of silicon oxide. In example embodiments, the upper insulating interlayer 270 may be planarized so that an upper surface of the upper insulating interlayer may be flat.

Figure 22:
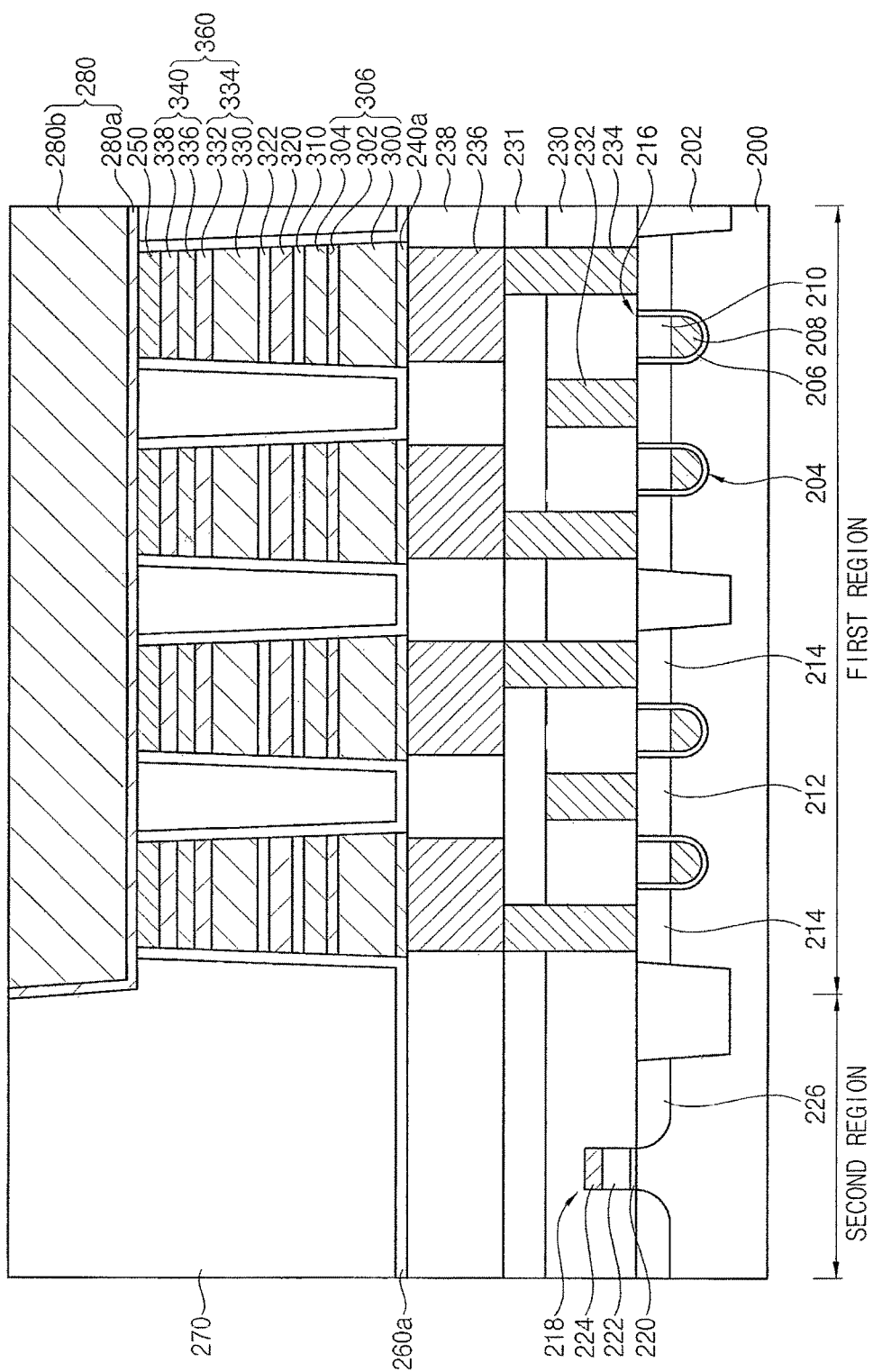

Referring to FIG. 22, the upper insulating interlayer 270 and the insulation capping layer 260 may be etched to form a trench for forming a bit line. The trench may extend in the third direction.

During the etching process, the insulation capping layer 260 on the upper electrode 250 may be etched to form an insulation capping pattern 260a. Thus, the upper electrode 250 may be exposed by the trench.

A bit line 280 may be formed in the trench. For example, the bit line 280 may be formed by forming a barrier layer on a sidewall and a bottom of the trench, forming a metal layer on the barrier layer to fill the trench, and planarizing upper surfaces of the metal layer and the barrier layer until the upper surface of the upper insulating interlayer 270 may be exposed. The barrier layer may be formed of a metal, e.g., titanium, tantalum, etc., and/or a metal nitride, e.g., titanium nitride, tantalum nitride, etc. The metal layer may include, e.g., Cu, W, Al, etc. Thus, the bit line 280 may include a barrier pattern 280a and a metal pattern 280b. The bit line 280 may contact upper electrode 250.

A third insulating interlayer may be further formed to cover the upper insulating interlayer 270 and the bit line 280.

The MRAM device according to example embodiments may be used in various types of electronic devices, e.g., mobile devices, memory cards, computers, etc.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the claims.

What is claimed is:

1. A magnetoresistive random access memory device, comprising: a free layer; a tunnel barrier layer directly contacting a first one of upper or lower surfaces of the free layer; an insulation barrier layer directly contacting a second one of the upper or lower surfaces of the free layer; a pinned layer structure contacting the tunnel barrier layer and including at least one pinned layer; and a vertical polarizer structure contacting the insulation barrier layer, the vertical polarizer structure including a plurality of magnetization multi-layered structures sequentially stacked, each of the magnetization multi-layered structures including a non-magnetic layer and a magnetic layer sequentially stacked, wherein the at least one pinned layer contacting the tunnel barrier layer and the magnetic layer of one of the plurality of magnetization multi-layered structures contacting the insulation barrier layer have magnetization directions anti-parallel to each other, the magnetic layers in at least two of the plurality of magnetization multi-layered structures having different thicknesses based on a magnetization direction of the at least one pinned layer relative to a magnetization direction of the pinned layer structure, wherein a layers-structure in the pinned layer structure stacked from the tunnel barrier layer is different from a layers-structure in the vertical polarizer structure stacked from the insulation barrier layer.

2. The device as claimed in claim 1, wherein the pinned layer structure includes a lower pinned layer, a spacer, and an upper pinned layer sequentially stacked.

3. The device as claimed in claim 2, wherein:
each of the lower and upper pinned layers includes a magnetic material having vertical anisotropy, and
thicknesses of the lower and upper pinned layers are different.

4. The device as claimed in claim 2, wherein magnetization directions of the lower and upper pinned layers are anti-parallel to each other.

5. The device as claimed in claim 1, wherein the magnetization multi-layered structures have magnetization directions anti-parallel to each other.

6. The device as claimed in claim 1, wherein the magnetic layer of one of the magnetization multi-layered structures has a thickness greater than thicknesses of the magnetic layers of other ones of the magnetization multi-layered structures.

7. The device as claimed in claim 1, wherein:
the magnetic layer of each of the magnetization multi-layered structures includes a magnetic material having vertical anisotropy, and
the non-magnetic layer of each of the magnetization multi-layered structures includes a metal.

8. The device as claimed in claim 1, wherein each of the tunnel barrier layer and the insulation barrier layer includes aluminum oxide or magnesium oxide.

9. The device as claimed in claim 1, wherein the pinned layer structure is under the free layer.

10. The device as claimed in claim 1, wherein the pinned layer structure is on the free layer.

11. The device as claimed in claim 1, wherein:
the pinned layer structure includes one pinned layer, and
the magnetic layer of one of the magnetization multi-layered structures at an even-numbered level from the insulation barrier layer has a thickness greater than thicknesses of the magnetic layers of other ones of the magnetization multi-layered structures.

12. A magnetoresistive random access memory device, comprising: a free layer; a tunnel barrier layer directly contacting a first one of upper or lower surfaces of the free layer; an insulation barrier layer directly contacting a second one of the upper or lower surfaces of the free layer; a pinned layer structure contacting the tunnel barrier layer and including at least one pinned layer; and a vertical polarizer structure contacting the insulation barrier layer, the vertical polarizer structure including a plurality of magnetization multi-layered structures sequentially stacked, each of the magnetization multi-layered structures including a non-magnetic layer and a magnetic layer sequentially stacked, wherein the magnetic layer of one of the magnetization multi-layered structures has a thickness greater than thicknesses of the magnetic layers of other ones of the magnetization multi-layered structures, the thickness of the magnetic layer of the one of the plurality of magnetization multi-layered structures based on a magnetization direction of the at least one pinned layer relative to a magnetization direction of the pinned layer structure, wherein a layers-structure in the pinned layer structure stacked from the tunnel barrier layer is different from a layers-structure in the vertical polarizer structure stacked from the insulation barrier layer.

13. The device as claimed in claim 12, wherein the magnetization multi-layered structures have magnetization directions anti-parallel to each other.

14. The device as claimed in claim 12, wherein:
a magnetization direction of the pinned layer contacting the tunnel barrier layer is equal to a magnetization direction of the pinned layer structure, and
the magnetic layer of one of the magnetization multi-layered structures at an even-numbered level from the insulation barrier layer has a thickness greater than thicknesses of the magnetic layers of other ones of the magnetization multi-layered structures.

15. The device as claimed in claim 12, wherein:
a magnetization direction of the pinned layer contacting the tunnel barrier layer is different from a magnetization direction of the pinned layer structure, and
the magnetic layer of one of the magnetization multi-layered structures at an odd-numbered level from the insulation barrier layer has a thickness greater than thicknesses of the magnetic layers of other ones of the magnetization multi-layered structures.

16. A magnetoresistive random access memory, comprising: a free layer; a pinned layer structure on a first side of the free layer; and a vertical polarizer structure on a second side of the free layer, wherein the vertical polarizer structure includes a plurality of stacked magnetic multi-layer structures, each of the magnetic multi-layer structure including a non-magnetic layer and a magnetic layer, the magnetic layers in at least two of the plurality of magnetization multi-layered structures having different thicknesses based on a magnetization direction of at least one pinned layer in the pinned layer structure relative to a magnetization direction of the pinned layer structure, and wherein the pinned layer structure and a magnetic multi-layer structure adjacent to the free layer have magnetization directions anti-parallel to each other, wherein a layers-structure in the pinned layer structure stacked from the tunnel barrier layer is different from a layers-structure in the vertical polarizer structure stacked from the insulation barrier layer.

17. The memory as claimed in claim 16, wherein each of the magnetic multi-layer structures has a magnetization direction based on a thickness of the corresponding magnetic layer.

18. The memory as claimed in claim 16, wherein the pinned layer structure includes a lower pinned layer, a spacer, and an upper pinned layer sequentially stacked.

19. The memory as claimed in claim 18, wherein:
   each of the lower and upper pinned layers includes a magnetic material having vertical anisotropy, and
   thicknesses of the lower and upper pinned layers are different.

20. The memory as claimed in claim 18, wherein magnetization directions of the lower and upper pinned layers are anti-parallel to each other.

* * * * *